US012676198B2

(12) United States Patent (10) Patent No.: US 12,676,198 B2
Lien et al. (45) Date of Patent: Jul. 7, 2026

(54) ALTERNATIVE ERASE SCHEMES FOR RELIABILITY-RISK WORD LINES

(71) Applicant: Micron Technology, Inc., Boise, ID (US)

(72) Inventors: Yu-Chung Lien, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 167 days.

(21) Appl. No.: 18/784,022

(22) Filed: Jul. 25, 2024

(65) Prior Publication Data

US 2025/0087277 A1 Mar. 13, 2025

Related U.S. Application Data

(60) Provisional application No. 63/581,189, filed on Sep. 7, 2023.

(51) Int. Cl.
*G11C 16/08* (2006.01)
*G11C 16/16* (2006.01)
*G11C 16/34* (2006.01)
*G11C 11/56* (2006.01)
*G11C 16/04* (2006.01)

(52) U.S. Cl.
CPC .......... *G11C 16/3418* (2013.01); *G11C 16/08* (2013.01); *G11C 16/16* (2013.01); *G11C 11/5635* (2013.01); *G11C 16/0483* (2013.01); *G11C 16/3445* (2013.01)

(58) Field of Classification Search
CPC . G11C 11/5635; G11C 16/0483; G11C 16/08; G11C 16/16; G11C 16/3418; G11C 16/3445
USPC ...................................... 365/185.02
See application file for complete search history.

(56) References Cited

U.S. PATENT DOCUMENTS

| | | | | |
|---|---|---|---|---|
| 9,620,198 | B1 * | 4/2017 | Nam .................... | G11C 11/4085 |
| 11,127,467 | B1 * | 9/2021 | Wang .................. | G11C 16/349 |
| 2011/0044102 | A1 * | 2/2011 | Dong ................. | G11C 16/3418 |
| | | | | 365/185.29 |
| 2021/0304830 | A1 * | 9/2021 | Li .......................... | G06F 3/0688 |
| 2022/0208247 | A1 * | 6/2022 | Inuzuka ................. | G11C 16/10 |
| 2024/0281148 | A1 * | 8/2024 | Lai ........................ | G06F 3/0659 |

* cited by examiner

*Primary Examiner* — Ly D Pham
(74) *Attorney, Agent, or Firm* — Harrity & Harrity, LLP

(57) ABSTRACT

In some implementations, a memory device may receive, from a host device, an erase command associated with erasing host data from a portion of a memory. The memory device may determine that the portion of the memory is associated with a reliability risk. The memory device may perform, based on determining that the portion of the memory is associated with the reliability risk, an alternative erase scheme to erase the host data from the portion of the memory, wherein during a first portion of the alternative erase scheme, a first voltage is applied to even word lines and a second voltage, that is different from the first voltage, is applied to odd word lines, and wherein during a second portion of the alternative erase scheme, a third voltage is applied to the even word lines and a fourth voltage is applied to the odd word lines.

20 Claims, 15 Drawing Sheets

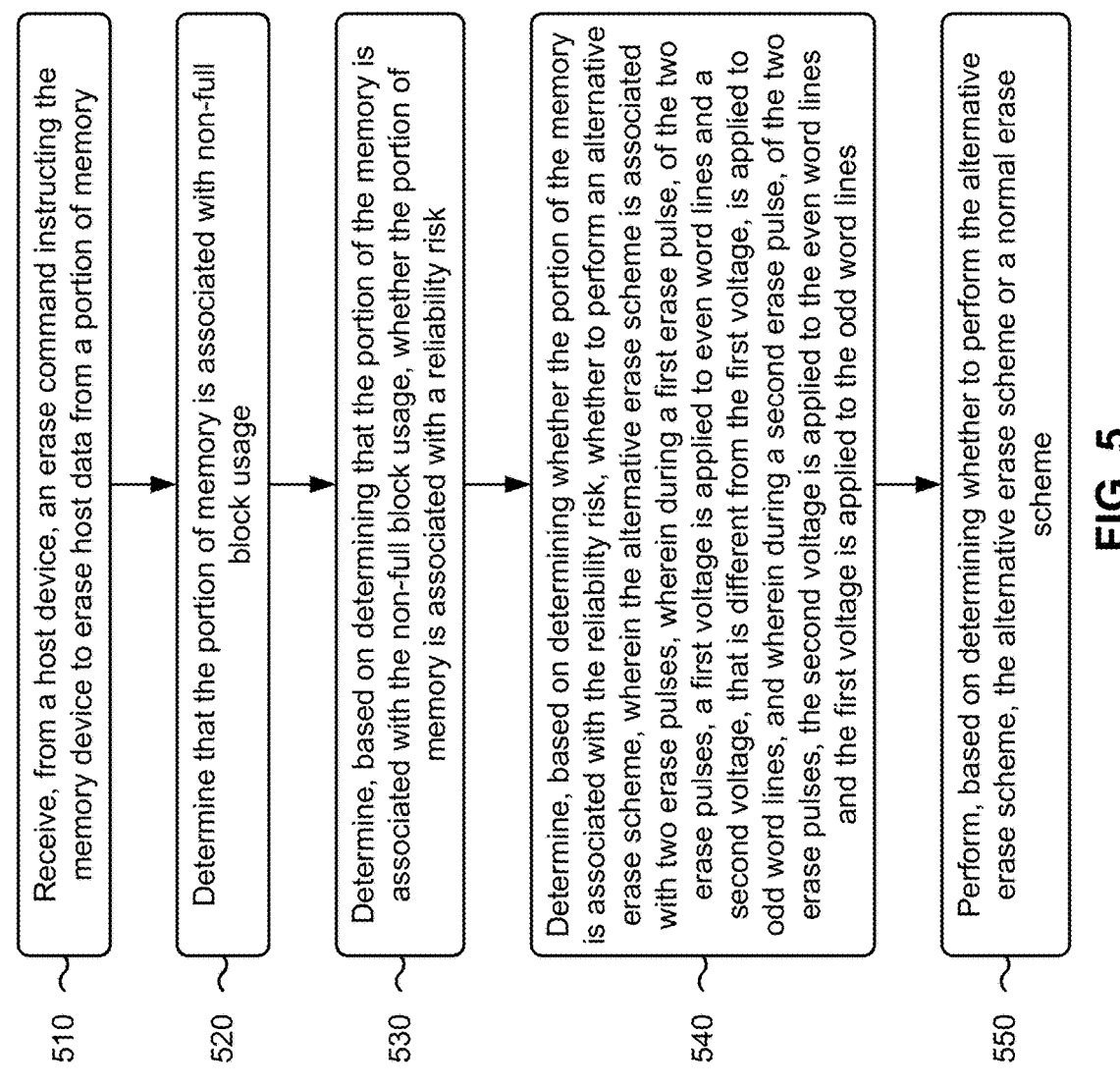

510 — Receive, from a host device, an erase command instructing the memory device to erase host data from a portion of memory 520 — Determine that the portion of memory is associated with non-full block usage 530 — Determine, based on determining that the portion of the memory is associated with the non-full block usage, whether the portion of memory is associated with a reliability risk 540 — Determine, based on determining whether the portion of the memory is associated with the reliability risk, whether to perform an alternative erase scheme, wherein the alternative erase scheme is associated with two erase pulses, wherein during a first erase pulse, of the two erase pulses, a first voltage is applied to even word lines and a second voltage, that is different from the first voltage, is applied to odd word lines, and wherein during a second erase pulse, of the two erase pulses, the second voltage is applied to the even word lines and the first voltage is applied to the odd word lines 550 — Perform, based on determining whether to perform the alternative erase scheme, the alternative erase scheme or a normal erase scheme

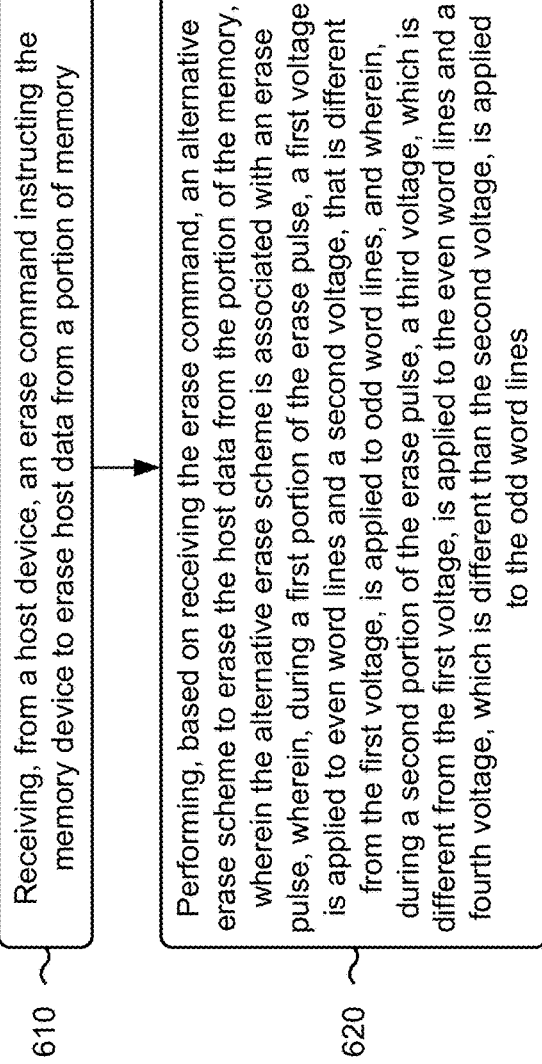

Receiving, from a host device, an erase command instructing the memory device to erase host data from a portion of memory

610

Performing, based on receiving the erase command, an alternative erase scheme to erase the host data from the portion of the memory, wherein the alternative erase scheme is associated with an erase pulse, wherein, during a first portion of the erase pulse, a first voltage is applied to even word lines and a second voltage, that is different from the first voltage, is applied to odd word lines, and wherein, during a second portion of the erase pulse, a third voltage, which is different from the first voltage, is applied to the even word lines and a fourth voltage, which is different than the second voltage, is applied to the odd word lines

620

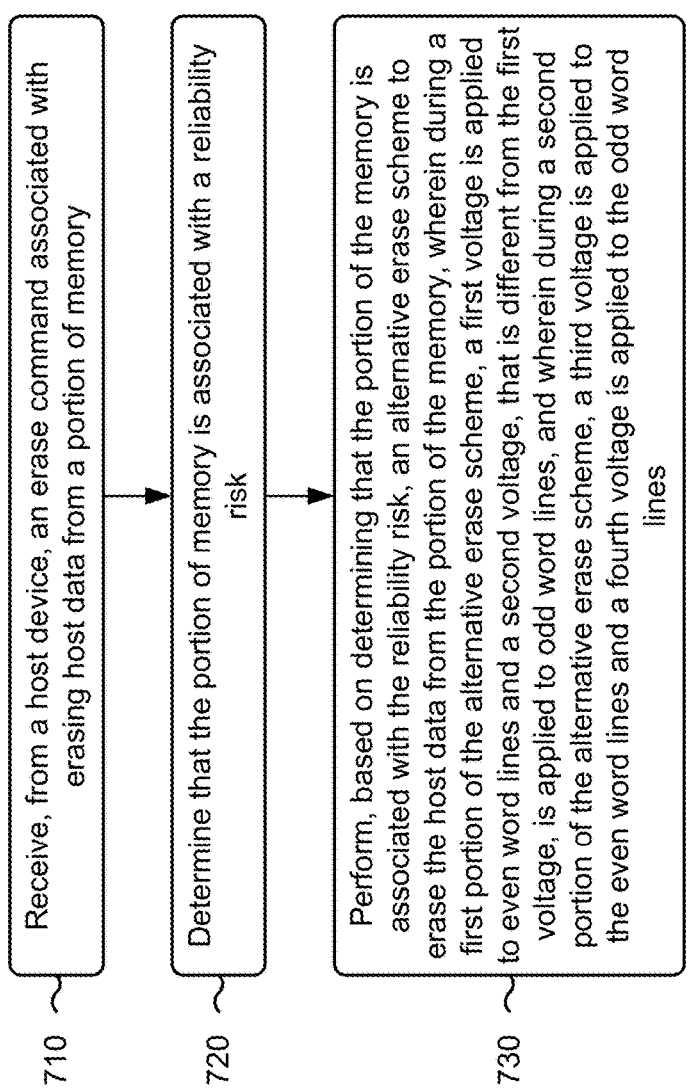

700

710 — Receive, from a host device, an erase command associated with erasing host data from a portion of memory 720 — Determine that the portion of memory is associated with a reliability risk 730 — Perform, based on determining that the portion of the memory is associated with the reliability risk, an alternative erase scheme to erase the host data from the portion of the memory, wherein during a first portion of the alternative erase scheme, a first voltage is applied to even word lines and a second voltage, that is different from the first voltage, is applied to odd word lines, and wherein during a second portion of the alternative erase scheme, a third voltage is applied to the even word lines and a fourth voltage is applied to the odd word lines

FIG. 7

ALTERNATIVE ERASE SCHEMES FOR RELIABILITY-RISK WORD LINES

CROSS-REFERENCE TO RELATED APPLICATION

This Patent application claims priority to U.S. Provisional Patent Application No. 63/581,189, filed on Sep. 7, 2023, entitled "ALTERNATIVE ERASE SCHEMES FOR RELI-ABILITY-RISK WORD LINES," and assigned to the assignee hereof. The disclosure of the prior Application is considered part of and is incorporated by reference into this Patent Application.

TECHNICAL FIELD

The present disclosure generally relates to memory devices, memory device operations, and, for example, to alternative erase schemes for reliability-risk word lines.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, an electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), holographic RAM (HRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

BRIEF DESCRIPTION OF THE DRAWINGS

FIGS. 4A-4I are diagrams of examples associated with alternative erase schemes for reliability-risk word lines.

FIG. 5 is a flowchart of an example method associated with alternative erase schemes for reliability-risk word lines.

FIG. 6 is a flowchart of another example method associated with alternative erase schemes for reliability-risk word lines.

FIG. 7 is a flowchart of another example method associated with alternative erase schemes for reliability-risk word lines.

DETAILED DESCRIPTION

Figure 1:
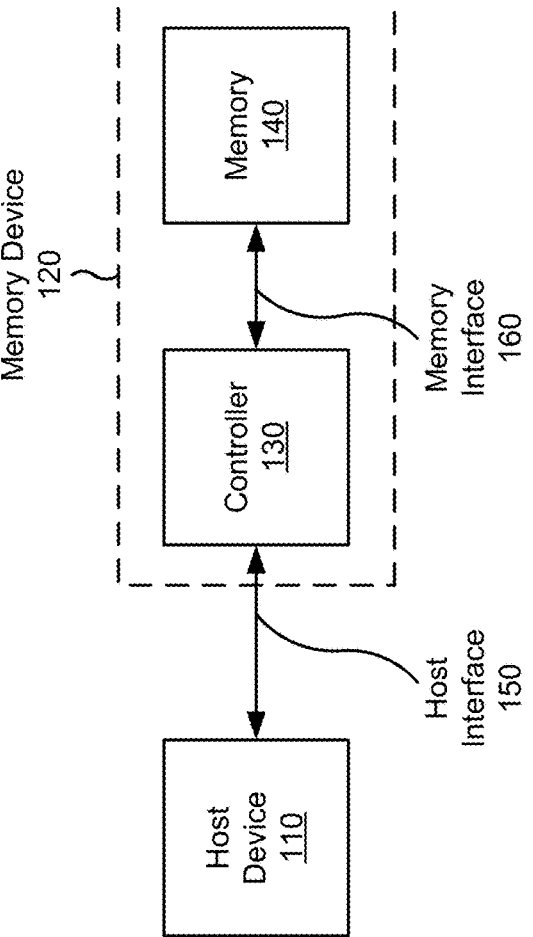
FIG. 1 is a diagram illustrating an example system capable of alternative erase schemes for reliability-risk word lines.

Memory cells may undergo program erase cycles (PECs) in which host data is written to the memory cells, such as in response to receiving a program command from a host device, and in which the host data is later erased from the memory cells, such as in response to receiving an erase command from the host device. During some erase schemes, sometimes referred to herein as normal erase schemes, a memory device may apply a small voltage (e.g., less than one volt), sometimes referred to as a bias voltage, to each word line of a block of memory while applying a greater voltage (e.g., several volts) to other portions of the block of memory (e.g., a bit line, a select gate drain (SGD), a select gate source (SGS), or the like) in order to cause tunneling of electrons stored in the various memory cells and thus reset a charged state of each memory cell, thereby erasing the host data from the memory cells. Applying the same voltage to each word line may result in tunneling of electrons in word line spacing (e.g., a spacing between two word lines) due the presence of fringing fields induced during the erase operation.

In some examples, in order to improve reliability of a memory, an alternative erase scheme may be implemented that reduces the presence of a fringing field during the erase operation and/or that reduces a number of holes that are otherwise created in the word line spacing during the erase operation. More particularly, during an alternative erase scheme, a memory device may apply, during a first erase pulse, a relatively small voltage (e.g., less than one volt) to a first subset of word lines (e.g., evenly indexed word lines) and a relatively large voltage (e.g., several volts) to a second subset of word lines (e.g., oddly indexed word lines), in order to cause tunneling of electrons stored only in the first subset of word lines and thus resetting a charged state of each memory cell only in the first subset of word lines. Then, during a second erase pulse, the memory device may apply a relatively small voltage (e.g., less than one volt) to the second subset of word lines (e.g., oddly indexed word lines) and a relatively large voltage (e.g., several volts) to the first subset of word lines (e.g., evenly indexed word lines), in order to cause tunneling of electrons stored only in the second subset of word lines and thus resetting a charged state of each memory cell only in the second subset of word lines. In this way, fringing fields that may otherwise be created during an erase operation may be reduced or eliminated, resulting in fewer holes injected in word line spacing (sometimes referred to as lateral charge migration mitigation) and thus better data retention.

Although the above-described alternative erase scheme may result in improved data retention as compared to a normal erase scheme, the improvements come at a cost of higher power consumption and increased time needed to complete the alternative erase scheme. More particularly, the alternative erase scheme may take approximately double the erase time as the normal erase scheme, because the alternative erase scheme may require two erase pulses rather than one erase pulse. Moreover, in light of the two erase pulses and the requirement to apply a relatively large voltage to a subset of word lines during each pulse, the alternative erase scheme may result in approximately two to three times the energy per bit (EPB) consumption of a normal erase scheme. Accordingly, selection of an erase scheme at a memory device may result in a tradeoff between relatively poor data retention, yet relatively low EPB consumption and relatively quick erase procedures, on one hand when employing a normal erase scheme, or else improved data retention, yet relatively high EPB consumption and relatively slow erase procedures, on the other hand when employing an alternative erase scheme.

Some implementations described herein enable an erase scheme that results in improved data retention as compared to using a normal erase scheme for erasing all portions of a memory, while also resulting in reduced power consumption and quicker erase procedures as compared to using an alternative erase scheme for erasing all portions of the memory. More particularly, in some implementations, a memory device may selectively implement a normal erase scheme for portions of a memory that are not associated with a reliability risk, while implementing an alternative erase scheme for other portions of the memory that are associated with the reliability risk. For example, in some implementations, the memory device may determine whether a portion of a memory associated with an erase command is associated with a reliability-risk portion of memory associated with non-full block usage, such as a lower deck of a non-full-block usage memory. If the portion of the memory is not associated with the reliability-risk portion of memory, the memory device may use a normal erase scheme to complete the erase command, thereby reducing power consumption and erase time as compared to alternative erase schemes. However, if the portion of the memory is associated with the reliability-risk portion of memory, the memory device may use an alternative erase scheme to complete the erase command, thereby improving data retention as compared to normal erase schemes. Additionally, or alternatively, in some implementations, an alternative erase scheme may be employed in which only a single erase pulse in used and bias voltages at the various subsets of word lines (e.g., evenly indexed word lines and oddly indexed word lines) are toggled during the single erase pulse. In such implementations, the memory may exhibit data retention improvements as compared to using a normal erase scheme, while reducing power consumption and erase time as compared to alternative erase schemes that utilize two separate erase pulses.

FIG. 1 is a diagram illustrating an example system 100 capable of alternative erase schemes for reliability-risk word lines. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device or apparatus configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device. In this case, the memory 140 may include non-volatile memory configured to maintain stored data after the memory device 120 is powered off. For example, the memory 140 may include NAND memory or NOR memory. In some implementations, the memory 140 may include volatile memory that requires power to maintain stored data and that loses stored data after the memory device 120 is powered off, such as one or more latches and/or random-access memory (RAM), such as dynamic RAM (DRAM) and/or static RAM (SRAM). For example, the volatile memory may cache data read from or to be written to non-volatile memory, and/or may cache instructions to be executed by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include control logic, a memory controller, a system controller, an ASIC, an FPGA, a processor, a microcontroller, and/or one or more processing components. In some implementations, the controller 130 may be a high-level controller, which may communicate directly with the host device 110 and may instruct one or more low-level controllers regarding memory operations to be performed in connection with the memory 140. In some implementations, the controller 130 may be a low-level controller, which may receive instructions regarding memory operations from a high-level controller that interfaces directly with the host device 110. As an example, a high-level controller may be an SSD controller, and a low-level controller may be a non-volatile memory controller (e.g., a NAND controller) or a volatile memory controller (e.g., a DRAM controller). In some implementations, a set of operations described herein as being performed by the controller 130 may be performed by a single controller (e.g., the entire set of operations may be performed by a single high-level controller or a single low-level controller). Alternatively, a set of operations described herein as being performed by the controller 130 may be performed by more than one controller (e.g., a first subset of the operations may be performed by a high-level controller and a second subset of the operations may be performed by a low-level controller).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, one or more systems, devices, apparatuses, components, and/or controllers of FIG. 1 may be configured to receive, from a host device (e.g., host device 110), an erase command instructing a memory device (e.g., memory device 120) to erase host data from a portion of a memory (e.g., memory 140); determine that the portion of the memory is associated with non-full block usage; determine, based on determining that the portion of the memory is associated with the non-full block usage, whether the portion of the memory is associated with a reliability risk; and determine, based on determining whether the portion of the memory is associated with the reliability risk, whether to perform an alternative erase scheme, wherein the alternative erase scheme is associated with two erase pulses, wherein during a first erase pulse, of the two erase pulses, a first voltage is applied to even word lines and a second voltage, that is different from the first voltage, is applied to odd word lines, and wherein during a second erase pulse, of the two erase pulses, the second voltage is applied to the even word lines and the first voltage is applied to the odd word lines; and perform, based on determining whether to perform the alternative erase scheme, the alternative erase scheme or a normal erase scheme.

In some implementations, one or more systems, devices, apparatuses, components, and/or controllers of FIG. 1 may be configured to receive, from a host device (e.g., host device 110), an erase command instructing a memory device (e.g., memory device 120) to erase host data from a portion of a memory (e.g., memory 140); and perform, based on receiving the erase command, an alternative erase scheme to erase the host data from the portion of the memory, wherein the alternative erase scheme is associated with an erase pulse, wherein, during a first portion of the erase pulse, a first voltage is applied to even word lines and a second voltage, that is different from the first voltage, is applied to odd word lines, and wherein, during a second portion of the erase pulse, a third voltage, which is different from the first voltage, is applied to the even word lines and a fourth voltage, which is different than the second voltage, is applied to the odd word lines.

In some implementations, one or more systems, devices, apparatuses, components, and/or controllers of FIG. 1 may be configured to receive, from a host device (e.g., host device 110), an erase command associated with erasing host data from a portion of a memory (e.g., memory 140); determine that the portion of the memory is associated with a reliability risk; and perform, based on determining that the portion of the memory is associated with the reliability risk, an alternative erase scheme to erase the host data from the portion of the memory, wherein during a first portion of the alternative erase scheme, a first voltage is applied to even word lines and a second voltage, that is different from the first voltage, is applied to odd word lines, and wherein during a second portion of the alternative erase scheme, a third voltage, which is different from the first voltage, is applied to the even word lines and a fourth voltage, which is different from the second voltage, is applied to the odd word lines.

As indicated above, FIG. 1 is provided as an example. Other examples may differ from what is described with regard to FIG. 1.

Figure 2:
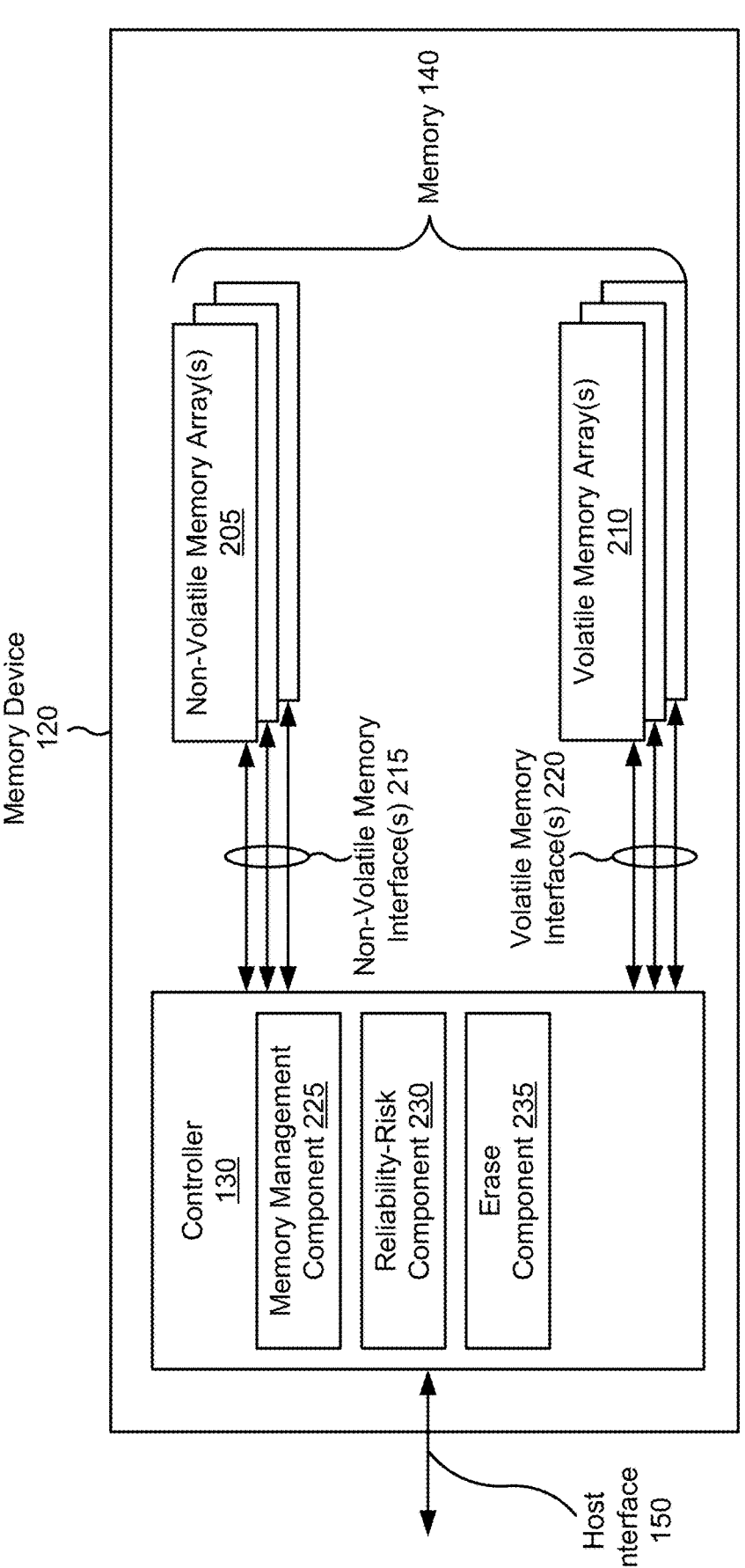
FIG. 2 is a diagram of example components included in a memory device.

FIG. 2 is a diagram of example components included in a memory device 120. As described above in connection with FIG. 1, the memory device 120 may include a controller 130 and memory 140. As shown in FIG. 2, the memory 140 may include one or more non-volatile memory arrays 205, such as one or more NAND memory arrays and/or one or more NOR memory arrays. Additionally, or alternatively, the memory 140 may include one or more volatile memory arrays 210, such as one or more SRAM arrays and/or one or more DRAM arrays. The controller 130 may transmit signals to and receive signals from a non-volatile memory array 205 using a non-volatile memory interface 215. The controller 130 may transmit signals to and receive signals from a volatile memory array 210 using a volatile memory interface 220.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 225, a reliability-risk component 230, and/or an erase component 235. In some implementations, one or more of these components are implemented as one or more instructions (e.g., firmware) executed by the controller 130. Alternatively, one or more of these components may be implemented as dedicated integrated circuits distinct from the controller 130.

The memory management component 225 may be configured to manage performance of the memory device 120. For example, the memory management component 225 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 225, such as information regarding memory block age, memory block erase count, and/or error information associated with a memory partition (e.g., a memory cell, a row of memory, a block of memory, or the like).

The reliability-risk component 230 may be configured to assess whether certain portions of the memory 140 are associated with a reliability risk and/or to identify portions of the memory 140 that are associated with the reliability risk. In some implementations, the reliability-risk component 230 may be configured to identify whether a portion of the memory 140 is associated with non-full block usage (e.g., one of a block by deck (BBD) scheme or a half good block (HGB) scheme, which are described in more detail herein), and/or if the portion of the memory 140 is associated with a reliability-risk deck, such as a lowermost deck of a multi-deck memory that is associated with non-full block usage.

The erase component 235 may be configured to selectively implement one of multiple candidate erase schemes. In some implementations, the erase component 235 may be configured to selectively implement a normal erase scheme, in which the erase component 235 may cause a small voltage (e.g., less than one volt) to be applied to each word line of a block of memory while causing a larger voltage to be applied to other portions of the block of memory (e.g., a bit line, an SGD, an SGS, or the like) in order to cause tunneling of electrons stored in the various memory cells and thus erase host data from the memory cells. In some other implementations, the erase component 235 may be configured to selectively implement an alternative erase scheme, in which the erase component 235 may cause, during a first time, a relatively small voltage (e.g., less than one volt) to be applied to a first subset of word lines (e.g., evenly indexed word lines) and a relatively large voltage (e.g., several volts) to be applied to a second subset of word lines (e.g., oddly indexed word lines) in order to erase host data only in the first subset of word lines, and may cause, during a second time, a relatively small voltage (e.g., less than one volt) to be applied to the second subset of word lines (e.g., oddly indexed word lines) and a relatively large voltage (e.g., several volts) to be applied to the first subset of word lines (e.g., evenly indexed word lines) in order to erase host data only in the second subset of word lines.

One or more devices or components shown in FIG. 2 may be configured to perform operations described herein, such as one or more operations and/or methods described in connection with FIGS. 3-7. For example, the controller 130, the memory management component 225, the reliability-risk component 230, and/or the erase component 235 may be configured to perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
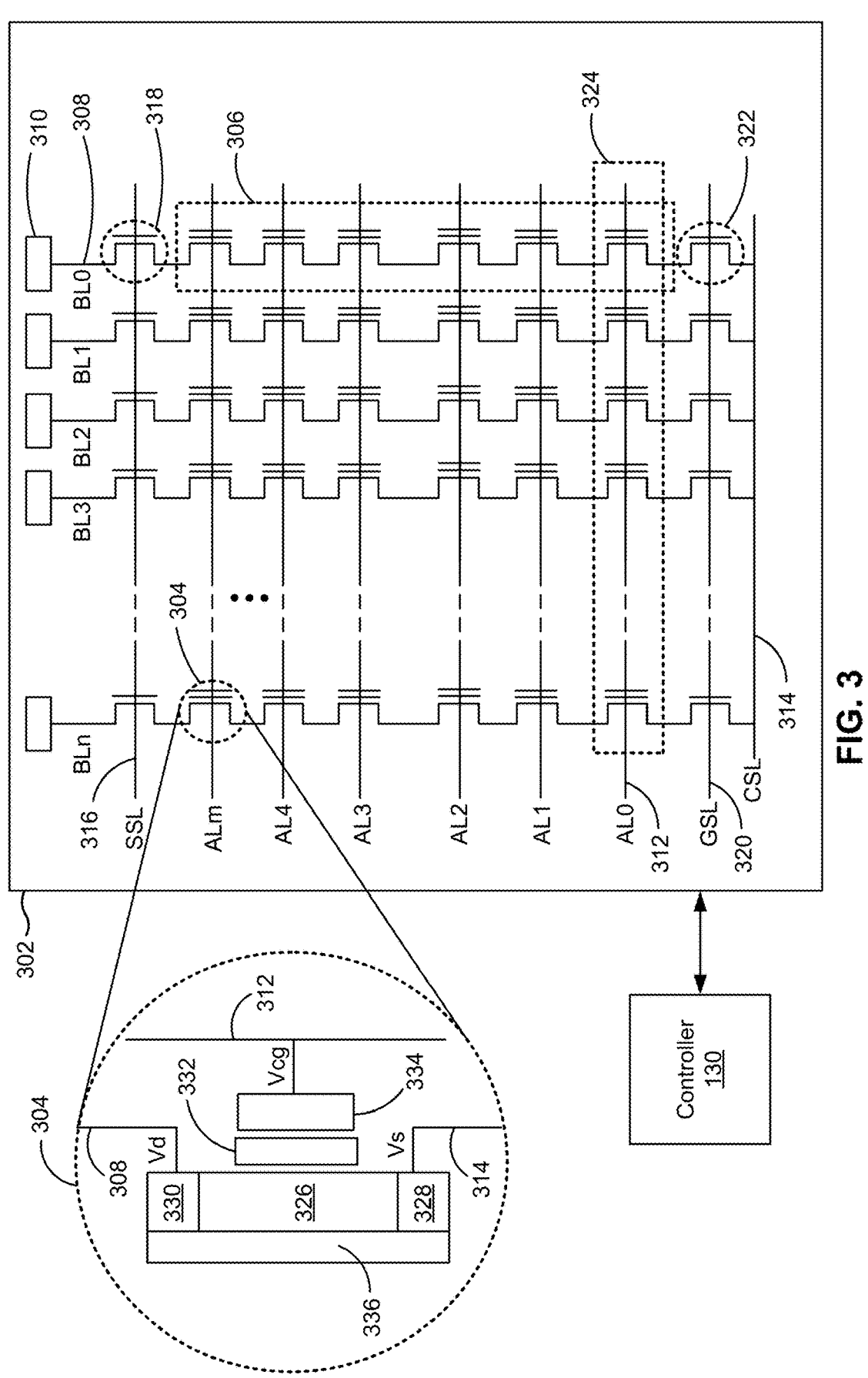
FIG. 3 is another diagram of example components included in a memory device.

FIG. 3 is a diagram of example components included in a memory device 120. As described above in connection with FIG. 1, the memory device 120 may include a controller 130 and memory 140. As shown in FIG. 3, the memory 140 may include a memory array 302, which may correspond to a non-volatile memory array 205 described above in connection with FIG. 2.

In FIG. 3, the memory array 302 is a NAND memory array. However, in some implementations, the memory array 302 may be another type of memory array, such as a NOR memory array, a resistive RAM (RRAM) memory array, a magnetoresistive RAM (MRAM) memory array, a ferroelectric RAM (FeRAM) memory array, a spin-transfer torque RAM (STT-RAM) memory array, or the like. In some implementations, the memory array 302 is part of a three-dimensional stack of memory arrays, such as 3D NAND flash memory, 3D NOR flash memory, or the like. Additionally, or alternatively, the memory array 302 may be associated with multiple memory decks and/or may be referred to as a multi-deck memory, which is described in more detail below in connection with FIGS. 4A-4I.

The memory array 302 includes multiple memory cells 304. A memory cell 304 may store an analog value, such as an electrical voltage or an electrical charge, that represents a data state (e.g., a digital value). The analog value and corresponding data state depend on a quantity of electrons trapped or present within a region of the memory cell 304 (e.g., in a charge trap, such as a floating gate), as described below.

A NAND string 306 (sometimes called a string) may include multiple memory cells 304 connected in series. A NAND string 306 is coupled to a bit line 308 (sometimes called a digit line or a column line, and shown as BL0-BLn). Data can be read from or written to the memory cells 304 of a NAND string 306 via a corresponding bit line 308 using one or more input/output (I/O) components 310 (e.g., an I/O circuit, an I/O bus, a page buffer, and/or a sensing component, such as a sense amplifier). Memory cells 304 of different NAND strings 306 (e.g., one memory cell 304 per NAND string 306) may be coupled with one another via access lines 312 (sometimes called word lines or row lines, and shown as AL0-ALm) that select which row (or rows) of memory cells 304 is affected by a memory operation (e.g., a read operation or a write operation).

A NAND string 306 may be connected to a bit line 308 at one end and a common source line (CSL) 314 at the other end. A string select line (SSL) 316 may be used to control respective string select transistors 318. A string select transistor 318 selectively couples a NAND string 306 to a corresponding bit line 308. A ground select line (GSL) 320 may be used to control respective ground select transistors 322. A ground select transistor 322 selectively couples a NAND string 306 to the common source line 314.

A "page" of memory (or "a memory page") may refer to a group of memory cells 304 connected to the same access line 312, as shown by reference number 324. In some implementations (e.g., for single-level cells), the memory cells 304 connected to an access line 312 may be associated with a single page of memory. In some implementations (e.g., for multi-level cells), the memory cells 304 connected to an access line 312 may be associated with multiple pages of memory, where each page represents one bit stored in each of the memory cells 304 (e.g., a lower page that represents a first bit stored in each memory cell 304 and an upper page that represents a second bit stored in each memory cell 304). In NAND memory, a page is the smallest physically addressable data unit for a write operation (sometimes called a program operation).

In some implementations, a memory cell 304 is a floating-gate transistor memory cell. In this case, the memory cell 304 may include a channel 326, a source region 328, a drain region 330, a floating gate 332, and a control gate 334. The source region 328, the drain region 330, and the channel 326 may be on a substrate 336 (e.g., a semiconductor substrate). The memory device 120 may store a data state in the memory cell 304 by charging the floating gate 332 to a particular voltage associated with the data state and/or to a voltage that is within a range of voltages associated with the data state. This results in a predefined amount of current flowing through the channel 326 (e.g., from the source region 328 to the drain region 330) when a specified read voltage is applied to the control gate 334 (e.g., by a corresponding access line 312 connected to the control gate 334). Although not shown, a tunnel oxide layer (or tunnel dielectric layer) may be interposed between the floating gate 332 and the channel 326, and a gate oxide layer (e.g., a gate dielectric layer) may be interposed between the floating gate 332 and the control gate 334. As shown, a drain voltage Vd may be supplied from a bit line 308, a control gate voltage Vcg may be supplied from an access line 312, and a source voltage Vs may be supplied via the common source line 314 (which, in some implementations, is a ground voltage).

To write or program the memory cell 304, Fowler-Nordheim tunneling may be used. For example, a strong positive voltage potential may be created between the control gate 334 and the channel 326 (e.g., by applying a large positive voltage to the control gate 334 via a corresponding access line 312) while current is flowing through the channel 326 (e.g., from the common source line 314 to the bit line 308, or vice versa). The strong positive voltage at the control gate 334 causes electrons within the channel 326 to tunnel through the tunnel oxide layer and be trapped in the floating gate 332. These negatively charged electrons then act as an electron barrier between the control gate 334 and the channel 326 that increases the threshold voltage of the memory cell 304. The threshold voltage is a voltage required at the control gate 334 to cause current (e.g., a threshold amount of current) to flow through the channel 326. Fowler-Nordheim tunneling is an example technique for storing a charge in the floating gate, and other techniques, such as channel hot electron injection, may be used.

To read the memory cell 304, a read voltage may be applied to the control gate 334 (e.g., via a corresponding access line 312), and an I/O component 310 (e.g., a sense amplifier) may determine the data state of the memory cell 304 based on whether current passes through the memory cell 304 (e.g., the channel 326) due to the applied voltage. A pass voltage may be applied to all memory cells 304 (other than the memory cell 304 being read) in the same NAND string 306 as the memory cell 304 being read. For example, the pass voltage may be applied on each access line 312 other than the access line 312 of the memory cell 304 being read (e.g., where the read voltage is applied). The pass voltage is higher than the highest read voltage associated with any memory cell data states so that all of the other memory cells 304 in the NAND string 306 conduct, and the I/O component 310 can detect a data state of the memory cell 304 being read by sensing current (or lack thereof) on a corresponding bit line 308. For example, in a single-level memory cell that stores one of two data states, the data state is a "1" if current is detected, and the data state is a "0" if current is not detected. In a multi-level memory cell that stores one of three or more data states, multiple read voltages are applied, over time, to the control gate 334 to distinguish between the three or more data states and determine a data state of the memory cell 304.

To erase the memory cell 304, a strong negative voltage potential may be created between the control gate 334 and the channel 326 (e.g., by applying a large negative voltage to the control gate 334 via a corresponding access line 312). The strong negative voltage at the control gate 334 causes trapped electrons in the floating gate 332 to tunnel back across the oxide layer from the floating gate 332 to the channel 326 and to flow between the common source line 314 and the bit line 308. This removes the electron barrier between the control gate 334 and the channel 326 and decreases the threshold voltage of the memory cell 304 (e.g., to an empty or erased state, which may represent a "1"). In some NAND memory, a block may be the smallest unit of memory that can be erased. A block of NAND memory includes multiple pages. Thus, in certain NAND memory, an individual page of a block cannot be erased without erasing every other page of the block. In some implementations, a block may be divided into multiple sub-blocks. A sub-block is a portion of a block and may include a subset of pages of the block and/or a subset of memory cells of the block. In some other types of NAND memory, less than a full block of the NAND memory may be erased, such as in the case of BBD programming and erase schemes and/or HGB programming and erase schemes. Aspects of BBD programming and erase schemes and HGB programming and erase schemes are described in more detail below in connection with FIGS. 4A-4I.

As indicated above, FIG. 3 is provided as an example. Other examples may differ from what is described with regard to FIG. 3.

FIGS. 4A-4I are diagrams of examples associated with alternative erase schemes for reliability-risk word lines. The operations described in connection with FIGS. 4A-4I may be performed by the memory device 120 and/or one or more components of the memory device 120, such as the controller 130 and/or one or more components of the controller 130.

Figure 4A:
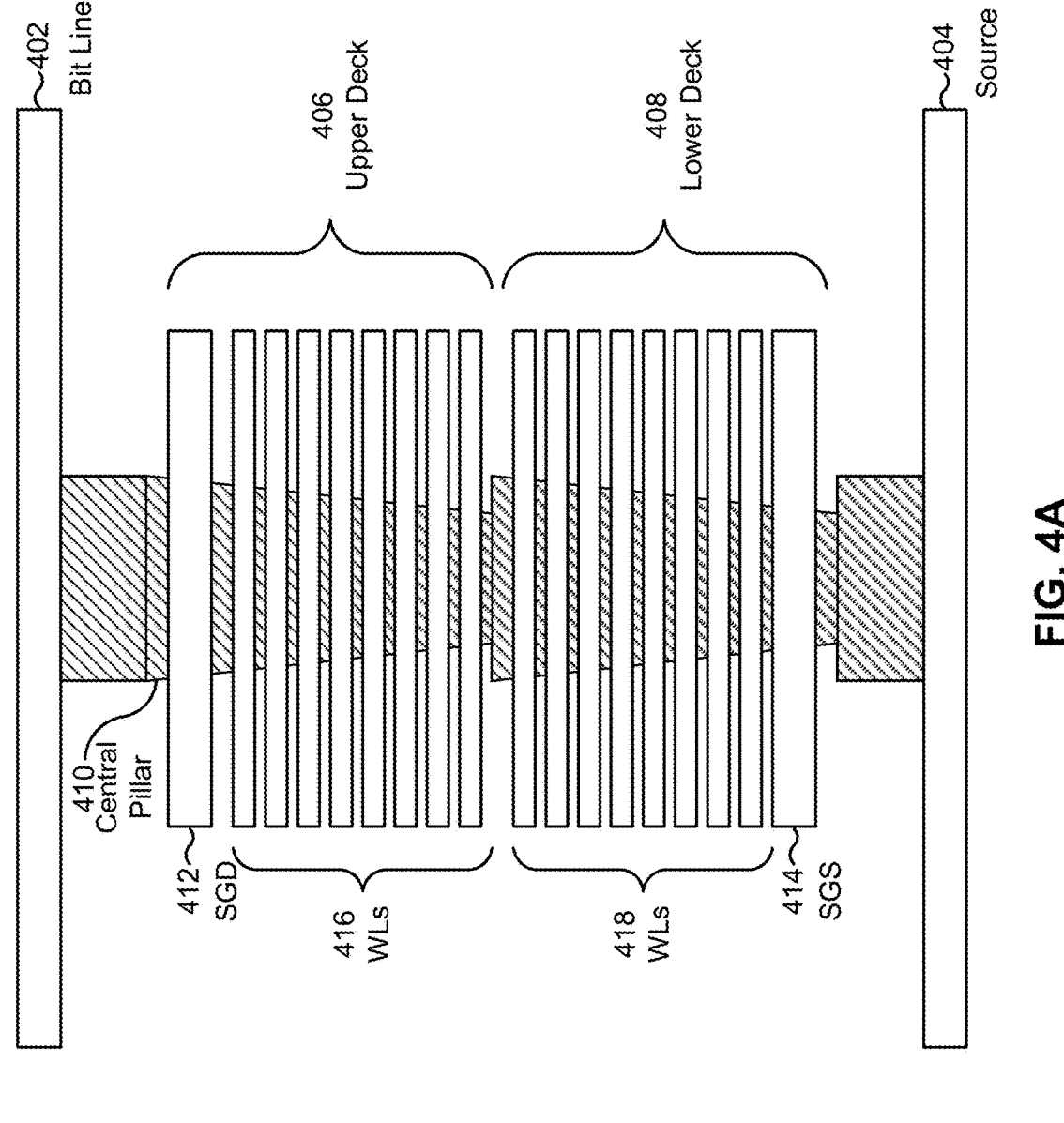

FIG. 4A shows an example of a block of memory associated with a multi-deck memory architecture 400, according to some implementations of the disclosure. The example multi-deck memory architecture 400 is a two deck memory architecture, but, in some other implementations, a multi-deck memory architecture may include a different number of decks (e.g., three or more decks of memory).

The multi-deck memory architecture 400 may include a bit line connection 402 (e.g., bit line 308) and a source line connection 404 (e.g., CSL 314), with an upper deck 406 of memory and a lower deck 408 of memory disposed in between the bit line connection 402 and the source line connection 404. The upper deck 406 and the lower deck 408 may be electrically coupled to one another, the bit line connection 402, and/or the source line connection 404 via a central pillar 410 (sometimes referred to as a memory hole). The multi-deck memory architecture 400 may further include an SGD 412, an SGS 414, and a set of word lines associated with each deck, including a first set of word lines 416 associated with the upper deck 406 and a second set of word lines associated with the lower deck 408. In some implementations, the SGD 412 may connect the central pillar 410 to the bit line connection 402, and the SGS 414 may connect the central pillar 410 to the source line connection 404.

Figure 4B:
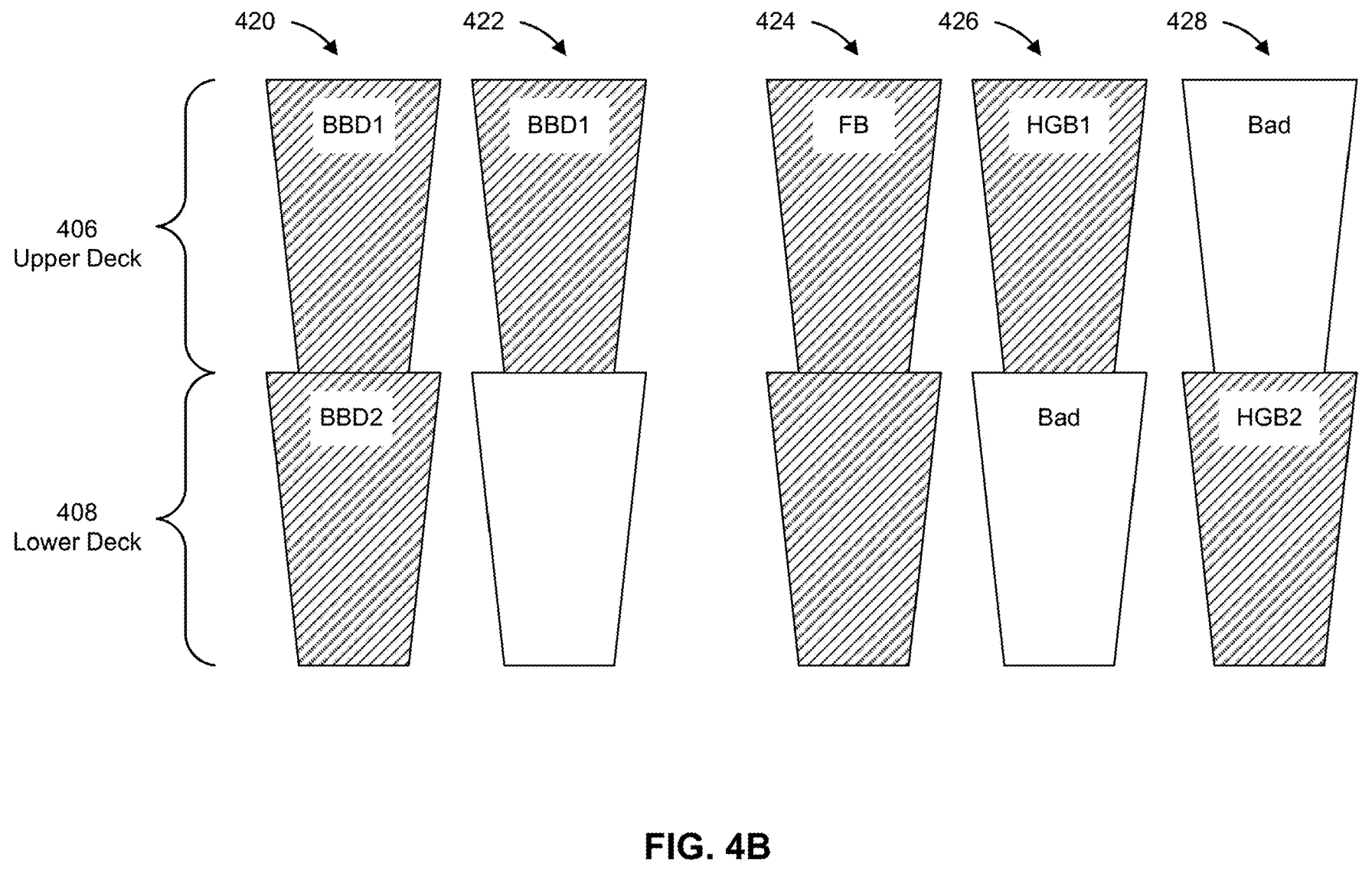

In some implementations, the multi-deck memory architecture 400 and similar architectures may be configured to operate each deck (e.g., each of the upper deck 406 and the lower deck 408) independent of each other, such that each deck may be erased without disturbing the other deck, programmed while the other deck is in various states (e.g., programmed, partially programmed, erased, or the like), read while the other deck is in various states, and/or the like. For example, FIG. 4B shows multiple blocks of memory employing a multi-deck memory architecture 400, with the decks operated independently of one another. In the examples shown in FIG. 4B, only the central pillar 410 of each block is shown for case of discussion.

In some implementations, a memory device may be capable of operating decks of memory independent of one another using a BBD programming and erase scheme. More particularly, reference numbers 420 and 422 show example blocks of memory in which the upper deck 406 and lower deck 408 are operated independent of one another using a BBD programming and erase scheme. In a BBD programming and erase scheme, a granularity of memory that may be programmed and/or erased may be a half block (e.g., a deck), with each deck capable of being erased and programmed independently. For example, in the example shown by reference number 420, both the upper deck 406 (shown as "BBD1") and the lower deck 408 (shown as "BBD2") may be used for memory operations (shown in FIG. 4B using cross-hatching), but each deck may be treated independently and thus may be programmed and/or erased independently of each other. In that regard, in some implementations of a BBD programming and erase scheme, less than all of a block may be used for memory operations (sometimes referred to herein as non-full block usage). More particularly, in the example indicted by reference number 422, the upper deck 406 (e.g., BBD1) may be used for memory operations (shown using cross-hatching), but the lower deck 408 may not be used for memory operations (shown as blank in FIG. 4B). In some implementations, in order to program a deck in a BBD programming and erase scheme, a memory device may utilize a center to edge (C2E) programming scheme (e.g., for single-level cell (SLC) BBD operations and/or quad-level cell (QLC) BBD operations), a drain to source (D2S) programming scheme (e.g., for triple-level cell (TLC) BBD operations), or the like. Operating each deck independently of one another using a BBD architecture may result in cost reduction as compared to full-block programming and erase schemes, per zone bandwidth gain and write amplification reduction as compared to full-block programming and erase schemes, or the like.

In some other implementations, a memory device may be capable of operating decks of memory independent of one another using an HGB programming and erase scheme. More particularly, reference numbers 424, 426, and 428 show example blocks of memory in which the upper deck 406 and lower deck 408 are operated independent of one another using an HGB programming and erase scheme. In HGB programming and erase schemes, if certain word lines in a deck become defective or otherwise unreliable and thus unusable for memory operations (such as due to a presence of a word-line-to-word-line short, an open word line, or the like), a memory device may cease using a deck associated with the unusable word lines for memory operations (e.g., the memory device may maintain the deck associated with the failed word lines in an erase state) but may continue to use the other deck for memory operations. For example, as indicated by reference number 424, when neither deck is associated with failed word lines, both the upper deck 406 and the lower deck 408 may be used for memory operations, which is sometimes referred to as a full block (FB) usage. However, as indicated by reference number 426, if the lower deck 408 becomes associated with failed word lines, shown by marking the lower deck 408 as "bad" in FIG. 4B, the memory device may maintain the lower deck 408 in an erase state, but the memory device may continue to use the upper deck 406 for memory operations (sometimes referred to herein as "HGB1"). Similarly, as indicated by reference number 428, if the upper deck 406 becomes associated with failed word lines, the memory device may maintain the upper deck 406 in an erase state, but the memory device may continue to use the lower deck 408 for memory operations (sometimes referred to herein as "HGB2"). In some implementations, in order to program a deck in an HGB programming and erase scheme, a memory device may utilize a D2S programming scheme, or the like. Utilizing an HGB programming and erase scheme to utilize a good deck of a block for memory operations rather than maintaining an entire block of memory in an erase state when failed word lines are identified may result in block rescue, yield improvement, cost reduction, and the like.

In some implementations, there may be systematic reliability differences between upper decks 406 and lower decks 408 during non-full block usage, such as upper decks 406 and lower decks 408 associated with a BBD programming and erase scheme, an HGB programming and erase scheme, or a similar non-full block usage programming and erase scheme. For example, a reliability level of a lower deck 408 in non-full block usage may be less than a reliability level of an upper deck 406 in non-full block usage. Accordingly, in some implementations, a memory device may selectively utilize an alternative erase scheme (which, as described above, may result in less word line spacing tunneling and/or improved data retention than a normal erase scheme) for reliability-risk decks in non-full block usage (e.g., lower decks 408) in order to improve data retention for those decks. However, for non-reliability-risk decks in non-full block usage (e.g., upper decks 406), the memory device may selectively utilize a normal erase scheme, such as for a purpose of reducing erase time as compared to the alternative erase scheme and/or reducing power and other resource consumption as compared to the alternative erase scheme.

Figure 4C:
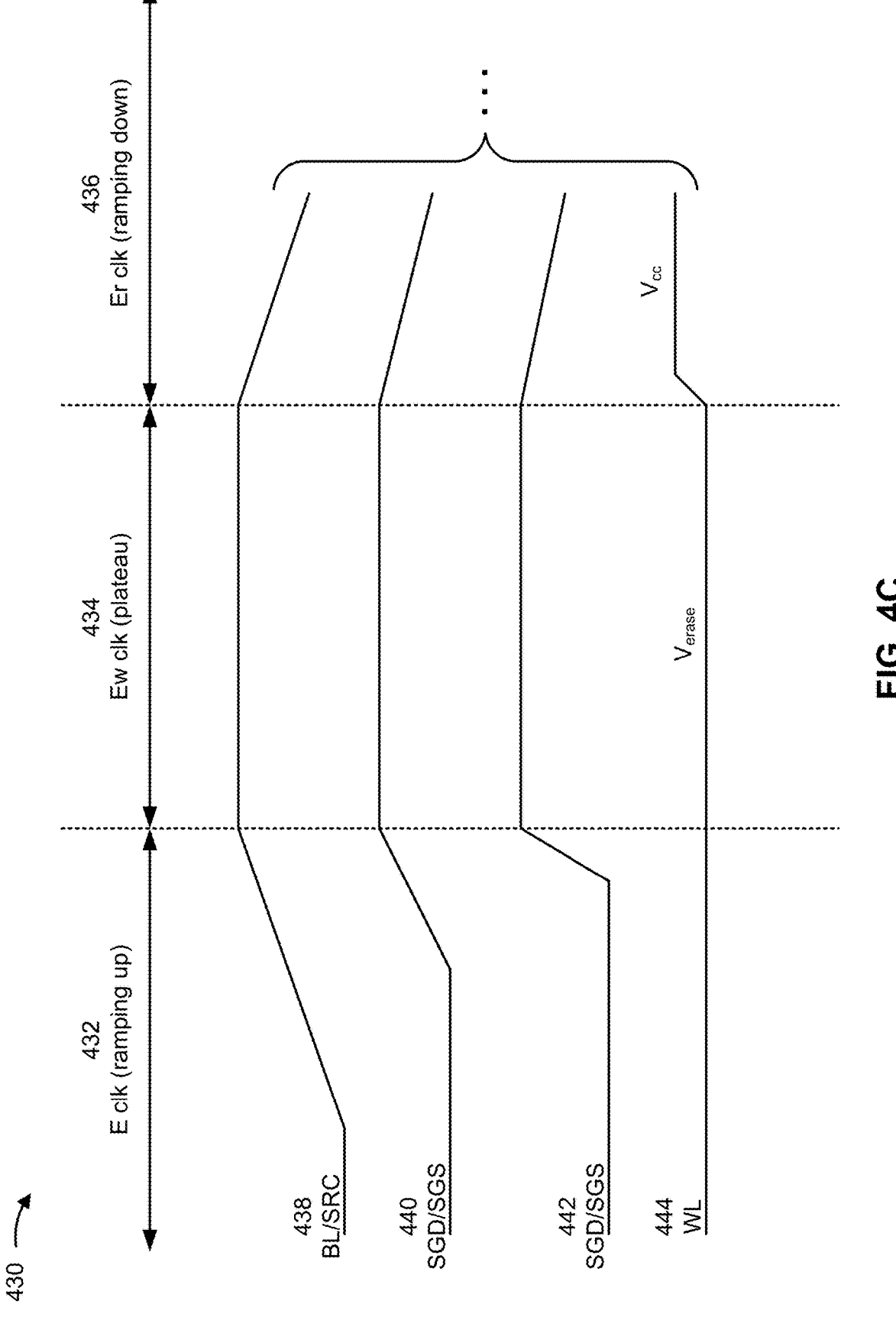

For example, FIG. 4C shows an example erase pulse 430 that may be utilized by a memory device during a normal erase scheme (e.g., an erase scheme used for non-reliability-risk decks in non-full block usage). As shown in FIG. 4C, the erase pulse 430 may include a ramping-up portion 432 (which may be associated with a first period of time of the erase pulse 430, sometimes referred to as an "E clk time" of the erase pulse 430), a plateau portion 434 (which may be associated with a second period of time of the erase pulse 430, sometimes referred to as an "Ew clk time" of the erase pulse 430), and a ramping-down portion 436 (sometimes referred to as a recovery portion of the erase pulse 430, and which may be associated with a third period of time of the erase pulse 430, sometimes referred to as an "Er clk time" of the erase pulse 430). During the ramping-up portion 432, the memory device may increase, or ramp up, a voltage on certain lines in the memory, such as a bit line (BL) (e.g., bit line connection 402), a source line (SRC) (e.g., source line connection 404), an SGD line (e.g., SGD 412), an SGS line (e.g., SGS 414), and/or word lines (WLs) (e.g., the first set of word lines 416 and/or the second set of word lines 418). More particularly, the various plots shown in FIG. 4C generally indicate a relative voltage level that may be applied to each of the above lines during the normal erase scheme, and more particularly during each portion (e.g., the ramping-up portion 432, the plateau portion 434, and the ramping-down portion 436) of the erase pulse 430.

For example, during the ramping-up portion 432 of the erase pulse 430, a voltage level on a BL and/or SRC (as indicated by reference number 438), a voltage on one of an SGD or an SGS (as indicated by reference number 440), and/or a voltage on the other of the SGD and/or the SGS (as indicated by reference number 442) may generally be increased, or ramped up. As indicated by reference number 444, a voltage level on the WLs being erased may be maintained relatively constant during the ramping-up portion 432, such as at a relatively small voltage (e.g., less than one volt), shown in FIG. 4C as "$V_{erase}$." During the plateau portion 434, relatively high voltage levels may be maintained at the BL, SRC, SGD, and/or SGS, while a relatively low voltage (e.g., $V_{erase}$) may be maintained on the WLs. This may cause tunneling of electrons from the various memory cells associated with the WLs during the plateau portion 434, causing the memory cells to erase host data therefrom (e.g., causing the memory cells to all reset to a state corresponding to bit "1"). Following the plateau portion, the relatively high voltages on the BL, SRC, SGD, and/or SGS may be reduced (e.g., ramped down), while the relatively low voltage at the WLs (e.g., $V_{erase}$) may be slightly increased, such as to a voltage level associated with a common collector voltage ($V_{CC}$).

Figure 4D:
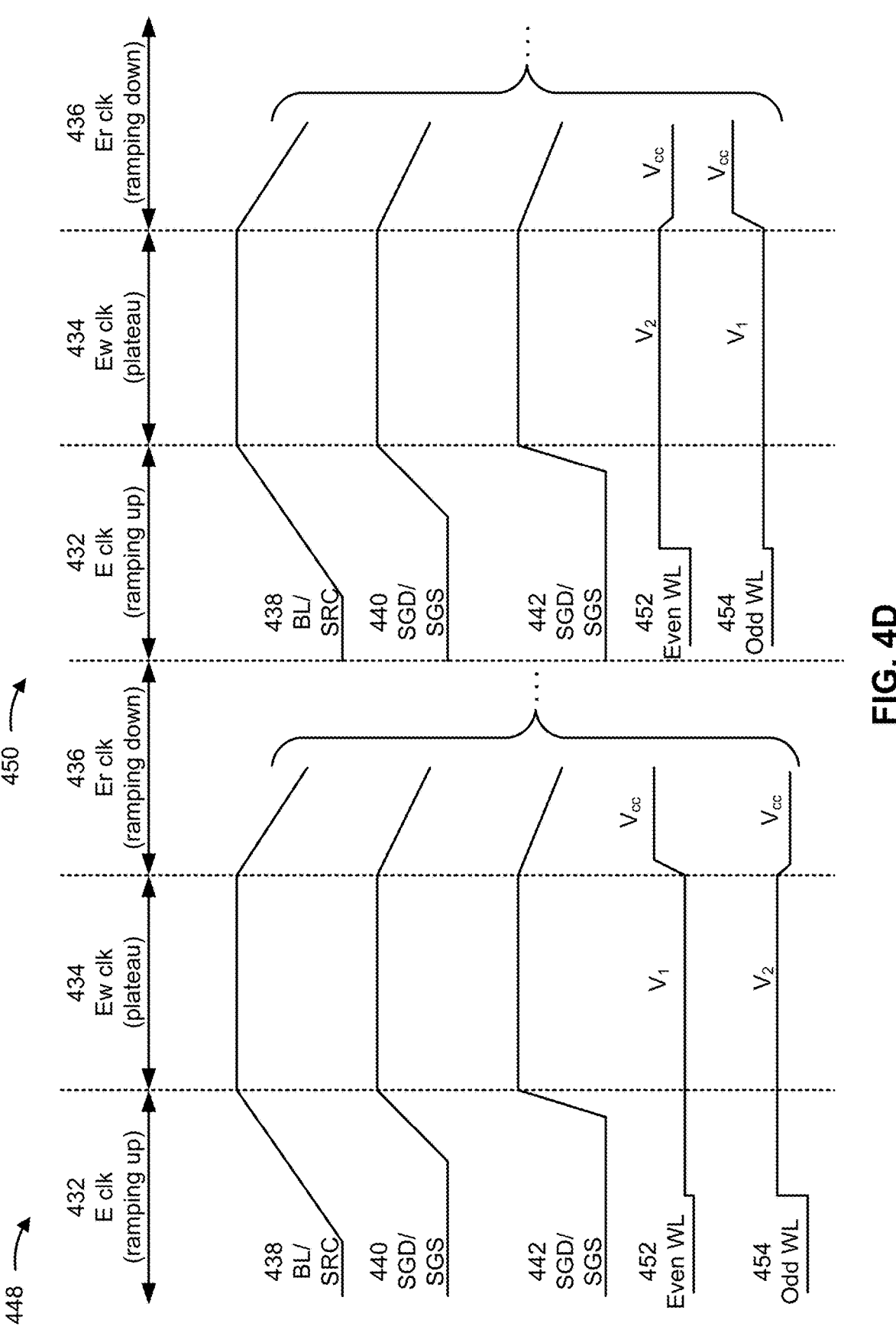

On the other hand, FIG. 4D shows example erase pulses (e.g., a first erase pulse 448 and a second erase pulse 450) that may be utilized by a memory device during an alternative erase scheme (e.g., an erase scheme selectively used for reliability-risk decks in non-full block usage). As shown in FIG. 4D, the voltages applied to the BL, SRC, SGD, and/or SGS may be the same during each erase pulse 448, 450 as the voltages described above in connection with the erase pulse 430 in FIG. 4C. However, in this implementation, different voltages may be applied to even odd WLs and even WLs during each erase pulse. For example, during the first erase pulse 448, a first voltage (shown as $V_1$) may be applied to even WLs, as indicated by reference number 452, and a second voltage (shown as $V_2$) may be applied to odd WLs, as indicated by reference number 454. In some implementations, the second voltage may be much higher than the first voltage. For example, the first voltage may be less than one volt, while the second voltage may be several volts. In that regard, during the plateau portion 434 of the first erase pulse 448, the memory cells associated with the even word lines may be erased, but the memory cells associated with the odd word lines may not be erased (e.g., may be maintained in a program state). Erasing only the even word lines, and not the odd word lines, in this manner may reduce the presence of fringing fields during the erase pulse 448 and thus reduce the presence of WL spacing tunneling, thereby increasing reliability (e.g., data retention) of the memory.

During the second erase pulse 450, the second voltage (e.g., $V_2$) may be applied to the even WLs, as indicated by reference number 452, and the first voltage (e.g., $V_1$) may be applied to the odd WLs, as indicated by reference number 454. In that regard, during the plateau portion 434 of the second erase pulse 450, the memory cells associated with the odd word lines may be erased, but the memory cells associated with the odd word lines may be left undisturbed. Erasing only the odd word lines, while not disturbing the even word lines, in this manner may again reduce the presence of fringing fields during the erase pulse and thus reduce the presence of WL spacing tunneling, thereby increasing reliability (e.g., data retention) of the memory. Following the plateau portion of the first erase pulse 448 and the second erase pulse 450, a voltage applied to each WL may be returned to $V_{cc}$, which, as shown in FIG. 4D, may include generally ramping down the voltage from $V_2$ to $V_{cc}$ for any word lines that are maintained at $V_2$ during a corresponding plateau portion 434 of an erase pulse 448, 450, and generally ramping up the voltage from $V_1$ to $V_{cc}$ for any word lines that are maintained at $V_1$ during a corresponding plateau portion 434 of an erase pulse 448, 450.

Figure 4E:
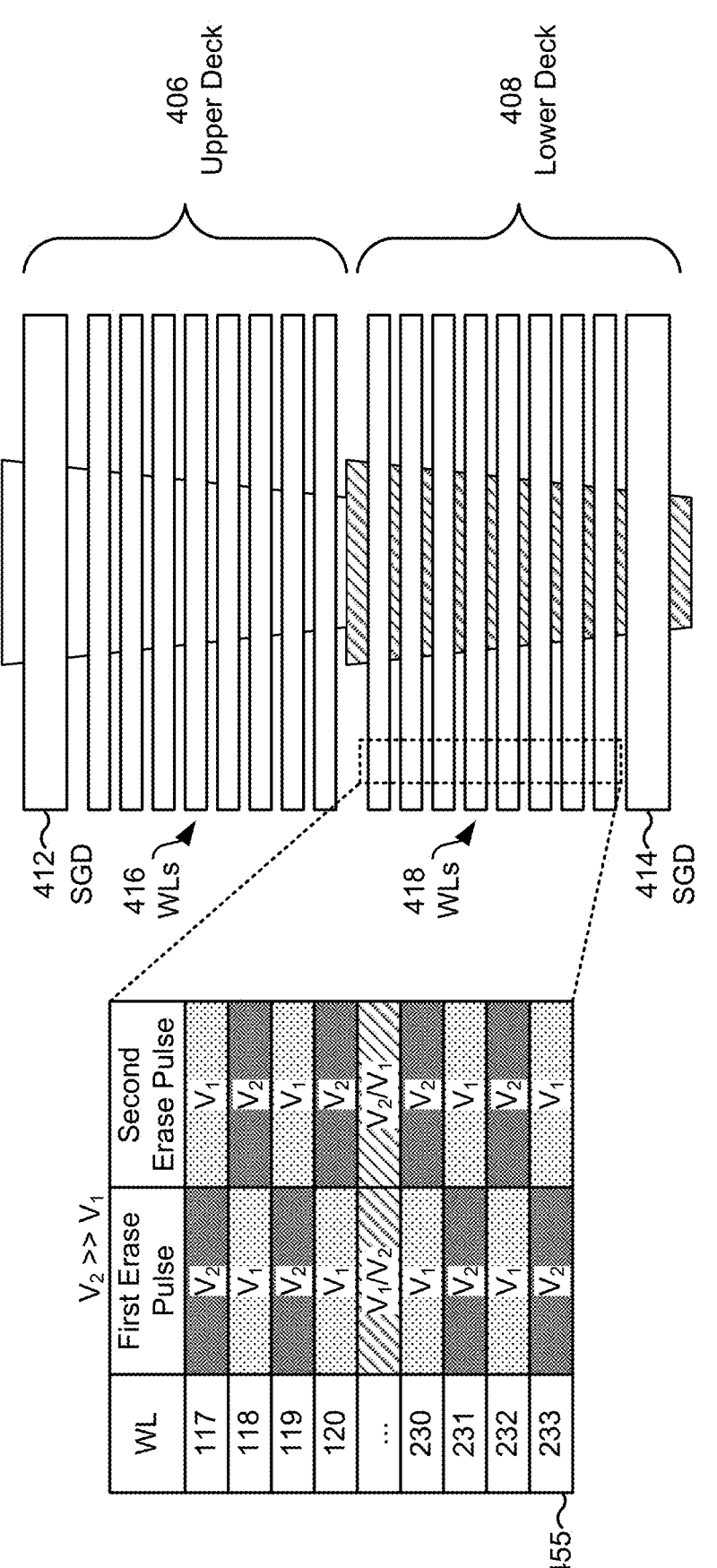

FIG. 4E illustrates an example of a memory device implementing the alternative erase scheme described above in connection with FIG. 4D for a reliability-risk deck in non-full block usage. As shown using cross-hatching in FIG. 4E, the lower deck 408 of the memory block is being used for memory operations, while, as shown using the absence of cross-hatching in FIG. 4E, the upper deck 406 of the memory block is not being used for memory operations. In this regard, the block of memory shown in FIG. 4E may be associated with a BBD programming and erase scheme, an HGB programming and erase scheme, or a similar programming and erase scheme. As described above, in some implementations, a lower deck 408 in non-full block usage may be associated with a reliability-risk deck. Accordingly, in response to receiving an erase command associated with the lower deck 408, the memory device may determine to use an alternative erase scheme in order to erase the host data from the lower deck 408. More particularly, as indicated by the table shown by reference number 455, during a first erase pulse (e.g., the first erase pulse 448), a first, relatively low voltage (e.g., $V_1$) may be applied to evenly indexed word lines, and a second, relatively high voltage (e.g., $V_2$) may be applied to oddly indexed word lines. Subsequently, during a second erase pulse (e.g., the second erase pulse 450), the second, relatively high voltage (e.g., $V_2$) may be applied to the evenly indexed word lines, and the first, relatively low voltage (e.g., $V_1$) may be applied to the oddly indexed word lines.

Figure 4F:
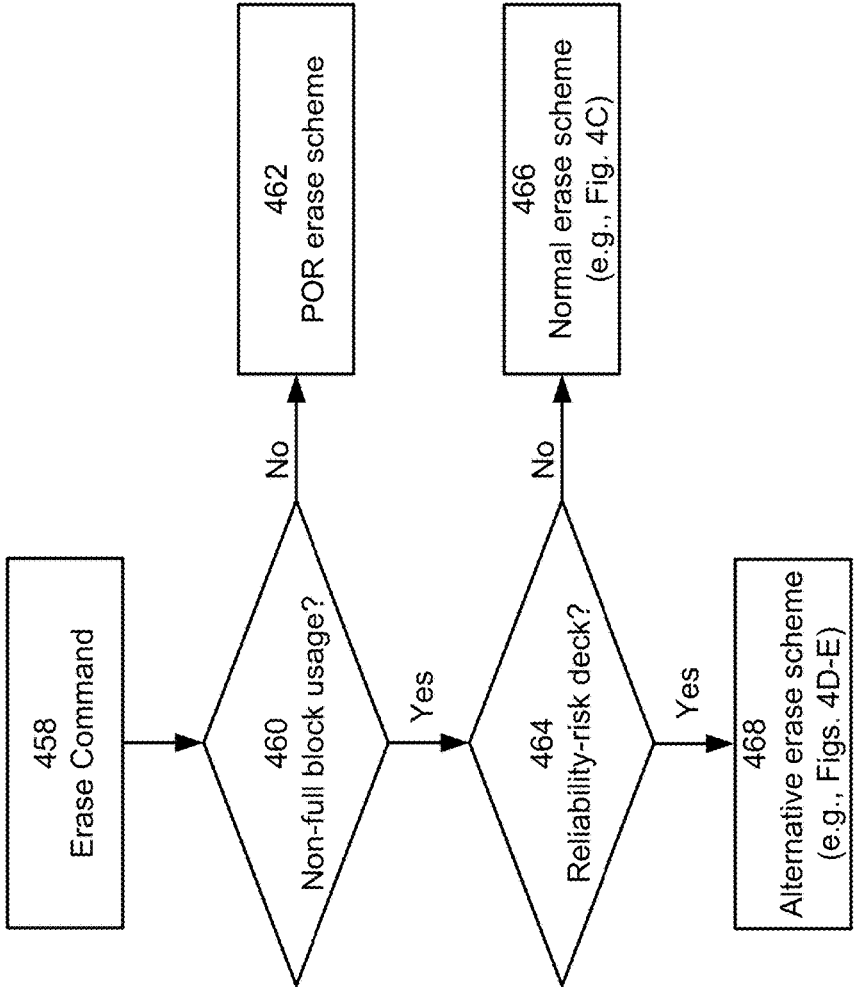

FIG. 4F illustrates an example 456 of operations that a memory device may perform when selectively implementing an alternative erase scheme for reliability-risk decks in non-full block usage. As shown by reference number 458, the memory device (e.g., memory device 120) may receive, from a host device (e.g., host device 110), an erase command instructing the memory device to erase host data from a portion of memory (e.g., a portion of the memory 140). For example, in some implementations the memory device may be associated with a multi-deck memory architecture (e.g., the multi-deck memory architecture 400), and the portion of the memory may be associated with one of the decks (e.g., the upper deck 406 or the lower deck 408) of the multi-deck memory architecture. Additionally, or alternatively, in some implementations, the memory may be associated with memory cells capable of storing multiple bits of information per memory cell. For example, the memory may be associated with one of a TLC memory, a QLC memory, a penta-level cell (PLC) memory, or the like.

As indicated by reference number 460, the memory device may determine whether the portion of the memory is associated with non-full block usage. For example, the memory device may determine whether the portion of the memory is associated with one of a BBD programming and erase scheme or a HGB programming and erase scheme as described above in connection with FIG. 4B, or a similar non-full block usage programming and erase scheme. As indicated by reference number 462, in implementations in which the memory device determines that the portion of the memory is not associated with non-full block usage (e.g., that the portion of the memory is associated with full block usage), the memory device may proceed with erasing the portion of the memory using a plan of record (POR) erase scheme. For example, in some implementations the POR erase scheme may correspond to a normal erase scheme, such as the normal erase scheme described above in connection with FIG. 4C.

As indicated by reference number 464, in implementations in which the memory device determines that the portion of the memory is associated with non-full block usage (e.g., the portion of the memory is associated with a BBD programming and erase scheme, an HGB programming and erase scheme, or the like), the memory device may determine whether the portion of the memory is associated with a reliability risk. For example, in implementations in which the portion of the memory is one deck of a multi-deck memory architecture, the memory device may determine whether the deck is a reliability-risk deck, such as a lowermost deck (e.g., lower deck 408) of the multi-deck memory architecture.

As indicated by reference number 466, in implementations in which the memory device determines that the portion of the memory is not a reliability risk (e.g., is not associated with a reliability-risk deck, such as an upper deck 406), the memory device may determine that a normal erase scheme is to be performed (e.g., the normal erase scheme described above in connection with FIG. 4C). Accordingly, in such implementations, the memory device may perform the normal erase scheme. This may result in reduced erase time and/or power consumption as always using an alternative erase scheme regardless of a reliability risk, because only a single erase pulse may be needed to complete the erase operation. Moreover, because, in such implementations, the portion of the memory is not associated with a reliability risk (e.g., the portion of the memory is associated with an upper deck 406), there may be little risk to reliability of the memory by implementing the normal erase scheme.

As indicated by reference number 468, in implementations in which the memory device determines that the portion of the memory is a reliability risk (e.g., is associated with a reliability-risk deck, such as the lower deck 408), the memory device may determine that an alternative erase scheme is to be performed (e.g., the alternative erase scheme described above in connection with FIGS. 4D-4E). Accordingly, in such implementations, the memory device may perform the alternative erase scheme. For example, the memory device may perform an alternative erase scheme that is associated with two erase pulses (e.g., the first erase pulse 448 and the second erase pulse 450), such that, during a first erase pulse, a first voltage (e.g., $V_1$) is applied to even word lines and a second voltage (e.g., $V_2$), that is different from the first voltage, is applied to odd word lines, and such that, during a second erase pulse, the second voltage is applied to the even word lines and the first voltage is applied to the odd word lines. This may result in improved data retention and/or reliability as compared to erase schemes in which a normal erase scheme is always utilized regardless of a reliability risk, because word line spacing tunneling may be reduced for reliability-risk decks.

As described above in connection with FIG. 4D, in some implementations employing an alternative erase scheme may result in approximately double an amount of time needed to execute an erase command, because two erase pulses (e.g., the first erase pulse 448 and the second erase pulse 450) may be used, each including its own ramping-up portion 432 (e.g., E clk time), plateau portion 434 (e.g., Ew clk time), and ramping down portion (e.g., Er clk time). In some examples, using an alternative erase scheme may thus degrade memory system performance due to the relatively lengthy erase time. For example, an erase time may be closely associated with write latency, such as in memory devices associated with an erase on demand (EOD) policy. Accordingly, if an alternative erase scheme is employed, such as for reliability-risk decks and/or as a POR erase scheme, host write latency may be nearly doubled and/or may not meet a performance requirement for a high-density drive.

Accordingly, in some implementations, a memory device may employ an alternative erase scheme associated with a single erase pulse (sometimes referred to herein as a one-pulse alternative erase scheme). For example, the memory device may use a one-pulse alternative erase scheme in which voltages at even and odd word lines are toggled during a plateau portion of the single erase pulse, which may result in improved memory device reliability and/or data retention as compared to utilizing a normal erase scheme, while resulting in a reduced erase time as compared to alternative erase schemes employing two erase pulses (sometimes referred to herein as two-pulse alternative erase schemes). For example, only a single ramping up portion and/or a single ramping down portion may need to be utilized, thereby decreasing erase time (e.g., eliminating one instance of an E clk time and an Er clk) as compared to a two-pulse alternative erase scheme.

Figure 4G:
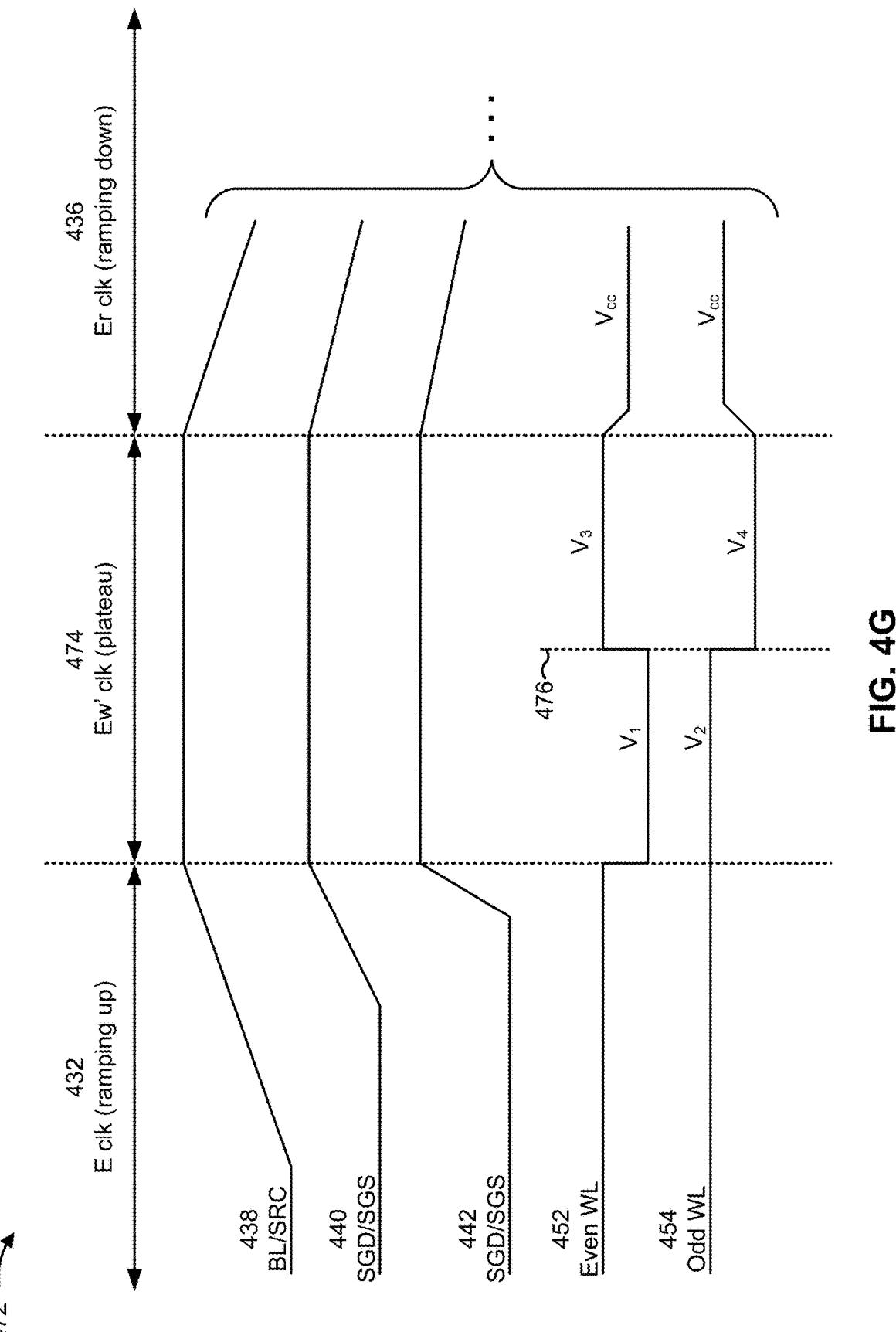

More particularly, FIG. 4G shows an example of an erase pulse 472 associated with a one-pulse alternative erase scheme in which voltages at even and odd word lines are toggled during a plateau portion 474 of the erase pulse 472 (sometimes referred to herein as an Ew' clk portion of the erase pulse 472, which may be approximately twice the duration of the Ew clk portion of the various erase pulses described above). As indicated by reference number 476, the memory device may be configured to toggle voltages applied to each subset of word lines (e.g., the even WLs, as indicated by reference number 452, and the odd WLs, as indicated by reference number 454) approximately halfway through the plateau portion 474 of the erase pulse 472 (e.g., approximately at a halfway point of the Ew' clk duration). More particularly, in response to receiving, from a host device (e.g., host device 110), an erase command instructing the memory device to erase host data from a portion of a memory, the memory device may perform a one-pulse alternative erase scheme associated with the erase pulse 472 shown in FIG. 4G. In some implementations, during a first portion of the erase pulse 472 (e.g., a portion of the plateau portion 474 occurring prior to the approximate halfway point indicated by reference number 476), a first voltage (e.g., $V_1$) may be applied to even word lines and a second voltage (e.g., $V_2$), that is different from the first voltage, may be applied to odd word lines. In the implementation shown in FIG. 4G, the first voltage is lower than the second voltage, and thus during the first portion of the erase pulse 472, the even word lines may be erased while the odd word lines remain undisturbed, in a similar manner as described above in connection with the first erase pulse 448 of the two-pulse alternative erase scheme shown in FIG. 4D.

Moreover, during a second portion of the erase pulse 472 (e.g., a portion of the plateau portion 474 occurring after the approximate halfway point indicated by reference number 476), a third voltage (e.g., $V_3$), which is different from the first voltage, may be applied to even word lines, and a fourth voltage (e.g., $V_4$), which is different from the second voltage, may be applied to odd word lines. In the implementation shown in FIG. 4G, the fourth voltage is lower than the third voltage, and thus during the second portion of the erase pulse 472, the odd word lines may be erased while the even word lines remain undisturbed, in a similar manner as described above in connection with the second erase pulse 450 of the two-pulse alternative erase scheme shown in FIG. 4D. In some implementations, voltages toggled at the even word lines and the odd word lines may be symmetrical, while, in some other implementations, voltages toggled at the even word lines and the odd word lines may not be symmetrical. For example, in some implementations, the first voltage (e.g., $V_1$) may be the same as the fourth voltage ($V_4$), and, similarly, the second voltage (e.g., $V_2$) may be the same as the third voltage (e.g., $V_3$). However, in some other implementations, the first voltage (e.g., $V_1$) may be different than the fourth voltage ($V_4$), and/or the second voltage (e.g., $V_2$) may be different than the third voltage (e.g., $V_3$).

Figure 4H:
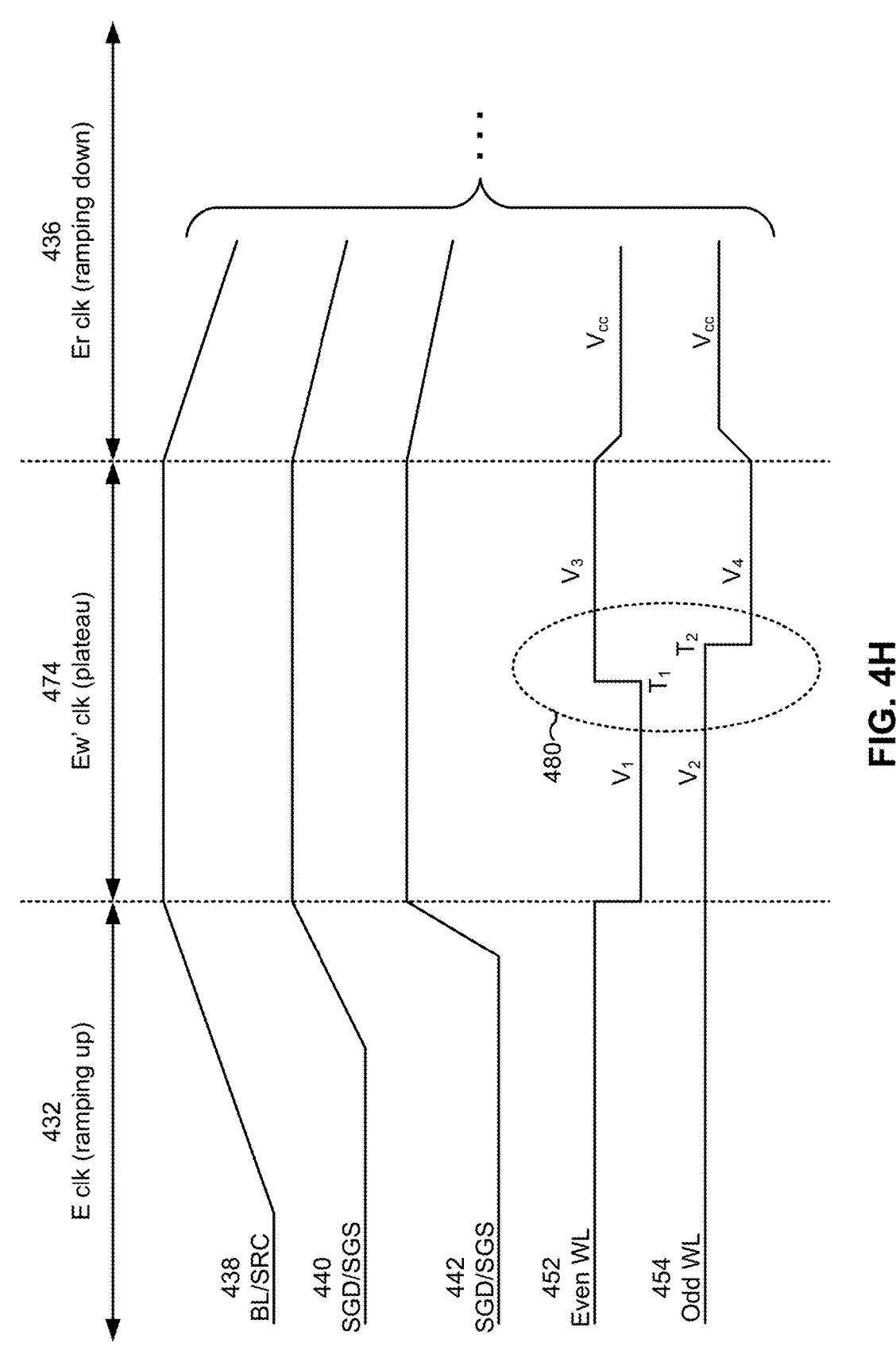

In the implementation shown in FIG. 4G, voltages at the even and odd word lines may be toggled at the same time (e.g., at the approximate halfway point of the plateau portion 474, indicated by reference number 476). More particularly, the memory device may switch between the first voltage (e.g., $V_1$) and the third voltage (e.g., $V_3$) at a first time (e.g., indicated by reference number 476), and, similarly, the memory device may switch between the second voltage (e.g., $V_2$) and the fourth voltage (e.g., $V_4$) at the first time. However, in some other implementations, a time at which voltages are toggled on the even word lines may be staggered from a time at which voltages are toggled on the odd word lines. More particularly, FIG. 4H shows an example erase pulse 478 associated with a one-pulse alternative erase scheme according to some other implementations. As indicated by reference number 480, a time at which voltages are toggled on the even and odd word lines may be staggered from one another. More particularly, the memory device may switch between the first voltage (e.g., $V_1$) and the third voltage (e.g., $V_3$) at a first time (shown as $T_1$), and the memory device may switch between the second voltage (e.g., $V_2$) and the fourth voltage (e.g., $V_3$) at a second time (shown as $T_2$) that is different from the first time. In the implementation shown in FIG. 4H, the second time occurs later in time during the plateau portion 474 of the erase pulse 478 than the first time (e.g., voltages at the odd word lines are toggled later in time than voltages at the even word lines). However, in some other implementations, the second time may occur prior to the first time (e.g., voltages at the odd word lines may be toggled prior to toggling voltages at the even word lines).

Figure 4I:
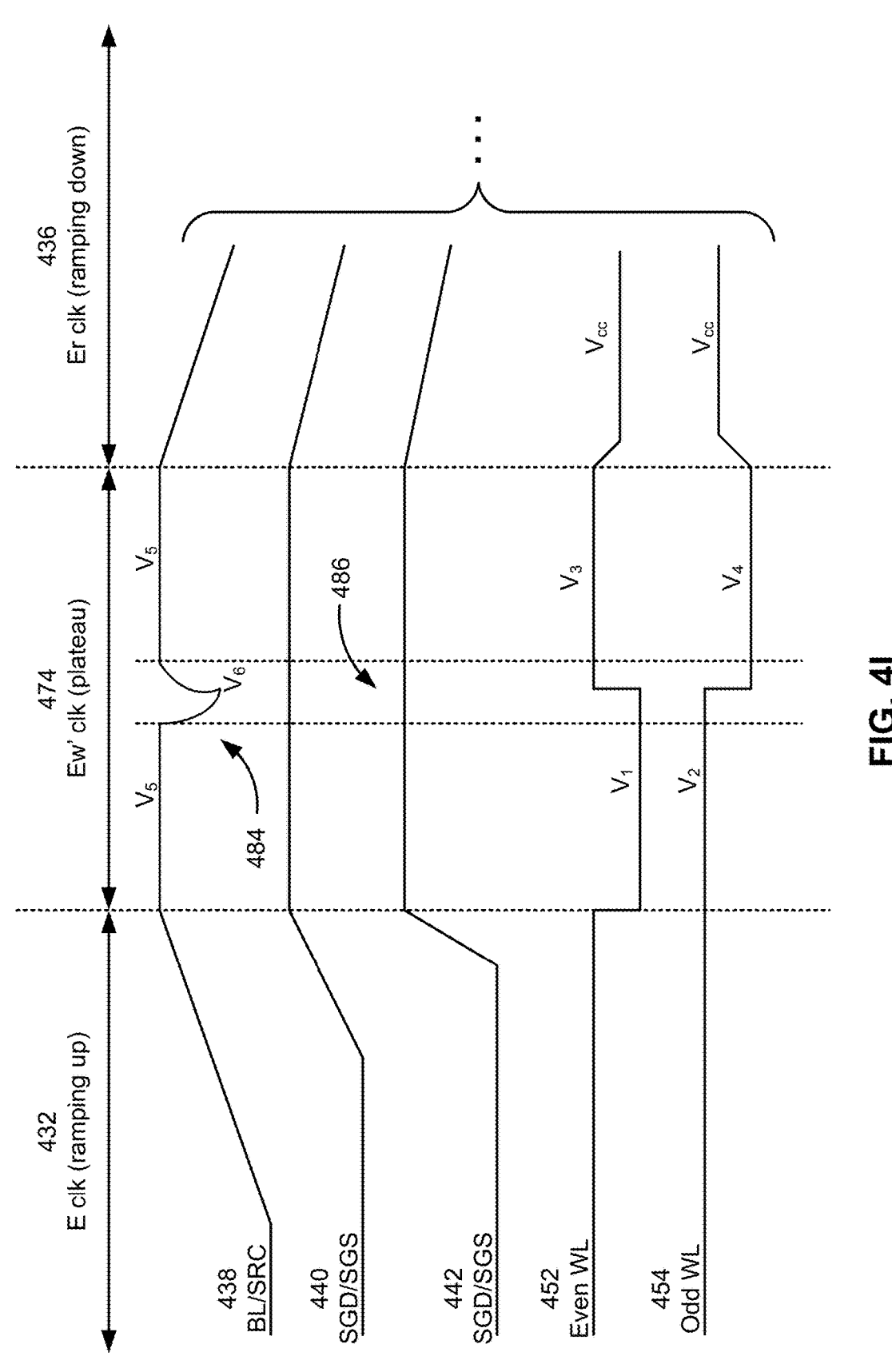

In some implementations, a voltage that is being applied to one or more other lines associated with the memory may be changed during a portion of the plateau portion 474 in which voltages are toggled at the even and/or odd word lines. For example, in some implementations, a voltage applied to a bit line connection and/or a source line connection may be reduced, or dipped, such as for a purpose of slowing down a gate-induced drain leakage (GIDL) hole generation when toggling between the voltages on the even and odd word lines. More particularly, FIG. 4I shows an example erase pulse 482 associated with a one-pulse alternative erase scheme according to some other implementations. As indicated by reference number 484, a voltage applied to the bit line connection and/or the source line connection may be dipped during a transition window 486, during which voltages are toggled at the word lines. That is, the memory device may switch between the first voltage (e.g., $V_1$) and the third voltage (e.g., $V_3$) during the transition window 486 and/or the memory device may switch between the second voltage (e.g., $V_2$) and the fourth voltage (e.g., $V_4$) during the transition window 486. For a purpose of reducing GIDL hole generation during the transition window 486, or the like, the memory device may dip a voltage at the bit line connection and/or the source line connection, such as from a fifth voltage (shown as $V_5$) that is applied at the bit line connection and/or the source line connection during most of the plateau portion 474 to a sixth voltage (shown as $V_6$). Put another way, in implementations in which the memory device switches between the first voltage (e.g., $V_1$) and the third voltage (e.g., $V_3$) during the transition window 486 and/or between the second voltage (e.g., $V_2$) and the fourth voltage (e.g., $V_4$) during the transition window 486, the memory device may apply the fifth voltage (e.g., $V_5$) to a bit line connection and/or a source line connection during a first portion of the erase pulse 482 (e.g., a portion of the plateau portion 474 that occurs prior to the transition window 486) and a second portion of the erase pulse (e.g., a portion of the plateau portion 474 that occurs after the transition window 486), and the memory device may apply the sixth voltage (e.g., $V_6$), that is less than the fifth voltage, to the bit line connection and/or the source line connection during the transition window 486.

Additionally, or alternatively, in some implementations, the memory device may be implement a word line voltage debias and/or a timing debias among word line groups (WLGs) in connection with one or more of the alternative erase schemes described above. More particularly, in some implementations, in order to perform an alternative erase scheme, the memory device may apply a voltage debias to a WLG associated with the portion of the memory for which the erase command was received and/or a timing debias to the WLG associated with the portion of the memory for which the erase command was received.

As indicated above, FIGS. 4A-4I are provided as an example. Other examples may differ from what is described with regard to FIGS. 4A-4I.

FIG. 5 is a flowchart of an example method 500 associated with alternative erase schemes for reliability-risk word lines. In some implementations, a memory device (e.g., the memory device 120) may perform or may be configured to perform the method 500. In some implementations, another device or a group of devices separate from or including the memory device (e.g., the system 100) may perform or may be configured to perform the method 500. Additionally, or alternatively, one or more components of the memory device (e.g., the controller 130, the memory management component 225, the reliability-risk component 230, and/or the erase component 235) may perform or may be configured to perform the method 500. Thus, means for performing the method 500 may include the memory device and/or one or more components of the memory device. Additionally, or alternatively, a non-transitory computer-readable medium may store one or more instructions that, when executed by the memory device (e.g., the controller 130 of the memory device 120), cause the memory device to perform the method 500.

As shown in FIG. 5, the method 500 may include receiving, from a host device, an erase command instructing the memory device to erase host data from a portion of a memory (block 510). As further shown in FIG. 5, the method 500 may include determining that the portion of the memory is associated with non-full block usage (block 520). As further shown in FIG. 5, the method 500 may include determining, based on determining that the portion of the memory is associated with the non-full block usage, whether the portion of the memory is associated with a reliability risk (block 530). As further shown in FIG. 5, the method 500 may include determining, based on determining whether the portion of the memory is associated with the reliability risk, whether to perform an alternative erase scheme, wherein the alternative erase scheme is associated with two erase pulses, wherein during a first erase pulse, of the two erase pulses, a first voltage is applied to even word lines and a second voltage, that is different from the first voltage, is applied to odd word lines, and wherein during a second erase pulse, of the two erase pulses, the second voltage is applied to the even word lines and the first voltage is applied to the odd word lines (block 540). As further shown in FIG. 5, the method 500 may include performing, based on determining whether to perform the alternative erase scheme, the alternative erase scheme or a normal erase scheme (block 550).

The method 500 may include additional aspects, such as any single aspect or any combination of aspects described below and/or described in connection with one or more other methods or operations described elsewhere herein.

In a first aspect, the non-full block usage is associated with one of a block by deck programming and erase scheme, or a half good block programming and erase scheme.

In a second aspect, alone or in combination with the first aspect, the method 500 includes determining, based on determining that the portion of the memory is a reliability risk, that the alternative erase scheme is to be performed, and determining, based on determining that the portion of the memory is not a reliability risk, that the normal erase scheme is to be performed.

In a third aspect, alone or in combination with one or more of the first and second aspects, the memory is associated with a multi-deck memory, and determining whether the portion of the memory is associated with a reliability risk includes determining whether the portion of the memory is associated with a lowermost deck, of the multi-deck memory.

In a fourth aspect, alone or in combination with one or more of the first through third aspects, the method 500 includes determining, based on determining that the portion of the memory is associated with the lowermost deck, that the alternative erase scheme is to be performed, and determining, based on determining that the portion of the memory is not associated with the lowermost deck, that the normal erase scheme is to be performed.

In a fifth aspect, alone or in combination with one or more of the first through fourth aspects, the memory is associated with one of a triple-level cell memory, a quad-level cell memory, or a penta-level cell memory.

Although FIG. 5 shows example blocks of a method 500, in some implementations, the method 500 may include additional blocks, fewer blocks, different blocks, or differently arranged blocks than those depicted in FIG. 5. Additionally, or alternatively, two or more of the blocks of the method 500 may be performed in parallel. The method 500 is an example of one method that may be performed by one or more devices described herein. These one or more devices may perform or may be configured to perform one or more other methods based on operations described herein.

FIG. 6 is a flowchart of an example method 600 associated with alternative erase schemes for reliability-risk word lines. In some implementations, a memory device (e.g., the memory device 120) may perform or may be configured to perform the method 600. In some implementations, another device or a group of devices separate from or including the memory device (e.g., the system 100) may perform or may be configured to perform the method 600. Additionally, or alternatively, one or more components of the memory device (e.g., the controller 130, the memory management component 225, the reliability-risk component 230, and/or the erase component 235) may perform or may be configured to perform the method 600. Thus, means for performing the method 600 may include the memory device and/or one or more components of the memory device. Additionally, or alternatively, a non-transitory computer-readable medium may store one or more instructions that, when executed by the memory device (e.g., the controller 130 of the memory device 120), cause the memory device to perform the method 600.

As shown in FIG. 6, the method 600 may include receiving, from a host device, an erase command instructing the memory device to erase host data from a portion of a memory (block 610). As further shown in FIG. 6, the method 600 may include performing, based on receiving the erase command, an alternative erase scheme to erase the host data from the portion of the memory, wherein the alternative erase scheme is associated with an erase pulse, wherein, during a first portion of the erase pulse, a first voltage is applied to even word lines and a second voltage, that is different from the first voltage, is applied to odd word lines, and wherein, during a second portion of the erase pulse, a third voltage, which is different from the first voltage, is applied to the even word lines and a fourth voltage, which is different than the second voltage, is applied to the odd word lines (block 620).

The method 600 may include additional aspects, such as any single aspect or any combination of aspects described below and/or described in connection with one or more other methods or operations described elsewhere herein.

In a first aspect, the erase pulse is associated with a ramping-up portion of the erase pulse, a plateau portion of the erase pulse, and a ramping-down portion of the erase pulse, and the first portion of the erase pulse and the second portion of the erase pulse occur during the plateau portion of the erase pulse.

In a second aspect, alone or in combination with the first aspect, the first voltage is the same as the fourth voltage, and the second voltage is the same as the third voltage.

In a third aspect, alone or in combination with one or more of the first and second aspects, the first voltage is different than the fourth voltage, and the second voltage is different than the third voltage.

In a fourth aspect, alone or in combination with one or more of the first through third aspects, the method 600 includes switching between the first voltage and the third voltage at the even word lines at a first time, and switching between the second voltage and the fourth voltage at the odd word lines at the first time.

In a fifth aspect, alone or in combination with one or more of the first through fourth aspects, the method 600 includes switching between the first voltage and the third voltage at the even word lines at a first time, and switching between the second voltage and the fourth voltage at the odd word lines at a second time that is different from the first time.

In a sixth aspect, alone or in combination with one or more of the first through fifth aspects, the method 600 includes switching between the first voltage and the third voltage during a transition window, switching between the second voltage and the fourth voltage during the transition window, applying a fifth voltage to a bit line associated with the portion of the memory during the first portion of the erase pulse and the second portion of the erase pulse, and applying a sixth voltage, that is less than the fifth voltage, to the bit line during the transition window.

In a seventh aspect, alone or in combination with one or more of the first through sixth aspects, the method 600 includes applying at least one of a voltage debias to a word line group (WLG) associated with the portion of the memory or a timing debias to the WLG associated with the portion of the memory.

Although FIG. 6 shows example blocks of a method 600, in some implementations, the method 600 may include additional blocks, fewer blocks, different blocks, or differently arranged blocks than those depicted in FIG. 6. Additionally, or alternatively, two or more of the blocks of the method 600 may be performed in parallel. The method 600 is an example of one method that may be performed by one or more devices described herein. These one or more devices may perform or may be configured to perform one or more other methods based on operations described herein.

FIG. 7 is a flowchart of an example method 700 associated with alternative erase schemes for reliability-risk word lines. In some implementations, a memory device (e.g., the memory device 120) may perform or may be configured to perform the method 700. In some implementations, another device or a group of devices separate from or including the memory device (e.g., the system 100) may perform or may be configured to perform the method 700. Additionally, or alternatively, one or more components of the memory device (e.g., the controller 130, the memory management component 225, the reliability-risk component 230, and/or the erase component 235) may perform or may be configured to perform the method 700. Thus, means for performing the method 700 may include the memory device and/or one or more components of the memory device. Additionally, or alternatively, a non-transitory computer-readable medium may store one or more instructions that, when executed by the memory device (e.g., the controller 130 of the memory device 120), cause the memory device to perform the method 700.

As shown in FIG. 7, the method 700 may include receiving, from a host device, an erase command associated with erasing host data from a portion of a memory (block 710). As further shown in FIG. 7, the method 700 may include determining that the portion of the memory is associated with a reliability risk (block 720). As further shown in FIG. 7, the method 700 may include performing, based on determining that the portion of the memory is associated with the reliability risk, an alternative erase scheme to erase the host data from the portion of the memory, wherein during a first portion of the alternative erase scheme, a first voltage is applied to even word lines and a second voltage, that is different from the first voltage, is applied to odd word lines, and wherein during a second portion of the alternative erase scheme, a third voltage is applied to the even word lines and a fourth voltage is applied to the odd word lines (block 730).

The method 700 may include additional aspects, such as any single aspect or any combination of aspects described below and/or described in connection with one or more other methods or operations described elsewhere herein.

In a first aspect, determining that the portion of the memory is associated with the reliability risk includes determining that the portion of the memory is associated with non-full block usage.

In a second aspect, alone or in combination with the first aspect, the alternative erase scheme is associated with two erase pulses, the first portion of the erase scheme occurs during a first erase pulse, of the two erase pulses, and the second portion of the erase scheme occurs during a second erase pulse, of the two erase pulses.

In a third aspect, alone or in combination with one or more of the first and second aspects, the memory is associated with a multi-deck memory, and determining that the portion of the memory is associated with the reliability risk includes determining that the portion of the memory is associated with a lowermost deck, of the multi-deck memory.

In a fourth aspect, alone or in combination with one or more of the first through third aspects, the alternative erase scheme is associated with an erase pulse, and the first portion of the erase scheme and the second portion of the erase scheme occur during the erase pulse.

In a fifth aspect, alone or in combination with one or more of the first through fourth aspects, the erase pulse is associated with a ramping-up portion of the erase pulse, a plateau portion of the erase pulse, and a ramping-down portion of the erase pulse, and the first portion of the erase scheme and the second portion of the erase scheme occur during the plateau portion of the erase pulse.

Although FIG. 7 shows example blocks of a method 700, in some implementations, the method 700 may include additional blocks, fewer blocks, different blocks, or differently arranged blocks than those depicted in FIG. 7. Additionally, or alternatively, two or more of the blocks of the method 700 may be performed in parallel. The method 700 is an example of one method that may be performed by one or more devices described herein. These one or more devices may perform or may be configured to perform one or more other methods based on operations described herein.

In some implementations, a memory device includes one or more components configured to: receive, from a host device, an erase command instructing the memory device to erase host data from a portion of a memory; determine that the portion of the memory is associated with non-full block usage; determine, based on determining that the portion of the memory is associated with the non-full block usage, whether the portion of the memory is associated with a reliability risk; and determine, based on determining whether the portion of the memory is associated with the reliability risk, whether to perform an alternative erase scheme, wherein the alternative erase scheme is associated with two erase pulses, wherein during a first erase pulse, of the two erase pulses, a first voltage is applied to even word lines and a second voltage, that is different from the first voltage, is applied to odd word lines, and wherein during a second erase pulse, of the two erase pulses, the second voltage is applied to the even word lines and the first voltage is applied to the odd word lines; and perform, based on determining whether to perform the alternative erase scheme, the alternative erase scheme or a normal erase scheme.

In some implementations, a memory device includes one or more components configured to: receive, from a host device, an erase command instructing the memory device to erase host data from a portion of a memory; and perform, based on receiving the erase command, an alternative erase scheme to erase the host data from the portion of the memory, wherein the alternative erase scheme is associated with an erase pulse, wherein, during a first portion of the erase pulse, a first voltage is applied to even word lines and a second voltage, that is different from the first voltage, is applied to odd word lines, and wherein, during a second portion of the erase pulse, a third voltage, which is different from the first voltage, is applied to the even word lines and a fourth voltage, which is different than the second voltage, is applied to the odd word lines.

In some implementations, a method includes receiving, from a host device, an erase command associated with erasing host data from a portion of a memory; determining that the portion of the memory is associated with a reliability risk; and performing, based on determining that the portion of the memory is associated with the reliability risk, an alternative erase scheme to erase the host data from the portion of the memory, wherein during a first portion of the alternative erase scheme, a first voltage is applied to even word lines and a second voltage, that is different from the first voltage, is applied to odd word lines, and wherein during a second portion of the alternative erase scheme, a third voltage is applied to the even word lines and a fourth voltage is applied to the odd word lines.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

When "a component" or "one or more components" (or another element, such as "a controller" or "one or more controllers") is described or claimed (within a single claim or across multiple claims) as performing multiple operations or being configured to perform multiple operations, this language is intended to broadly cover a variety of architectures and environments. For example, unless explicitly claimed otherwise (e.g., via the use of "first component" and "second component" or other language that differentiates components in the claims), this language is intended to cover a single component performing or being configured to perform all of the operations, a group of components collectively performing or being configured to perform all of the operations, a first component performing or being configured to perform a first operation and a second component performing or being configured to perform a second operation, or any combination of components performing or being configured to perform the operations. For example, when a claim has the form "one or more components configured to: perform X; perform Y; and perform Z," that claim should be interpreted to mean "one or more components configured to perform X; one or more (possibly different) components configured to perform Y; and one or more (also possibly different) components configured to perform Z."

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
   one or more components configured to:
      receive, from a host device, an erase command instructing the memory device to erase host data from a portion of a memory;
      determine that the portion of the memory is associated with non-full block usage;
      determine, based on determining that the portion of the memory is associated with the non-full block usage, whether the portion of the memory is associated with a reliability risk; and
      determine, based on determining whether the portion of the memory is associated with the reliability risk, whether to perform an alternative erase scheme,
         wherein the alternative erase scheme is associated with two erase pulses,
         wherein during a first erase pulse, of the two erase pulses, a first voltage is applied to even word lines and a second voltage, that is different from the first voltage, is applied to odd word lines, and
         wherein during a second erase pulse, of the two erase pulses, the second voltage is applied to the even word lines and the first voltage is applied to the odd word lines; and
      perform, based on determining whether to perform the alternative erase scheme, the alternative erase scheme or a normal erase scheme.

2. The memory device of claim 1, wherein the non-full block usage is associated with one of a block by deck programming and erase scheme, or a half good block programming and erase scheme.

3. The memory device of claim 1, wherein the one or more components, to determine whether to perform the alternative erase scheme, are configured to:
   determine, based on determining that the portion of the memory is associated with the reliability risk, that the alternative erase scheme is to be performed; and
   determine, based on determining that the portion of the memory is not associated with the reliability risk, that the normal erase scheme is to be performed.

4. The memory device of claim 1, wherein the memory is associated with a multi-deck memory, and
   wherein the one or more components, to determine whether the portion of the memory is associated with the reliability risk, are configured to determine whether the portion of the memory is associated with a lowermost deck, of the multi-deck memory.

5. The memory device of claim 4, wherein the one or more components, to determine whether to perform the alternative erase scheme, are configured to:

determine, based on determining that the portion of the memory is associated with the lowermost deck, that the alternative erase scheme is to be performed; and determine, based on determining that the portion of the memory is not associated with the lowermost deck, that the normal erase scheme is to be performed.

6. The memory device of claim 1, wherein the memory is associated with one of a triple-level cell memory, a quad-level cell memory, or a penta-level cell memory.

7. A memory device, comprising:

one or more components configured to:

receive, from a host device, an erase command instructing the memory device to erase host data from a portion of a memory; and perform, based on receiving the erase command, an alternative erase scheme to erase the host data from the portion of the memory, wherein the alternative erase scheme is associated with an erase pulse, wherein, during a first portion of the erase pulse, a first voltage is applied to even word lines and a second voltage, that is different from the first voltage, is applied to odd word lines, and wherein, during a second portion of the erase pulse, a third voltage, which is different from the first voltage, is applied to the even word lines and a fourth voltage, which is different than the second voltage, is applied to the odd word lines.

8. The memory device of claim 7, wherein the erase pulse is associated with a ramping-up portion of the erase pulse, a plateau portion of the erase pulse, and a ramping-down portion of the erase pulse, and wherein the first portion of the erase pulse and the second portion of the erase pulse occur during the plateau portion of the erase pulse.

9. The memory device of claim 7, wherein the first voltage is the same as the fourth voltage, and wherein the second voltage is the same as the third voltage.

10. The memory device of claim 7, wherein the first voltage is different than the fourth voltage, and wherein the second voltage is different than the third voltage.

11. The memory device of claim 7, wherein the one or more components, to perform the alternative erase scheme, are configured to:

switch between the first voltage and the third voltage at the even word lines at a first time; and switch between the second voltage and the fourth voltage at the odd word lines at the first time.

12. The memory device of claim 7, wherein the one or more components, to perform the alternative erase scheme, are configured to:

switch between the first voltage and the third voltage at the even word lines at a first time; and switch between the second voltage and the fourth voltage at the odd word lines at a second time that is different from the first time.

13. The memory device of claim 7, wherein the one or more components, to perform the alternative erase scheme, are configured to:

switch between the first voltage and the third voltage during a transition window;

switch between the second voltage and the fourth voltage during the transition window;

apply a fifth voltage to a bit line associated with the portion of the memory during the first portion of the erase pulse and the second portion of the erase pulse; and apply a sixth voltage, that is less than the fifth voltage, to the bit line during the transition window.

14. The memory device of claim 7, wherein the one or more components, to perform the alternative erase scheme, are configured to apply at least one of a voltage debias to a word line group (WLG) associated with the portion of the memory or a timing debias to the WLG associated with the portion of the memory.

15. A method, comprising:

receiving, from a host device, an erase command associated with erasing host data from a portion of a memory;

determining that the portion of the memory is associated with a reliability risk; and performing, based on determining that the portion of the memory is associated with the reliability risk, an alternative erase scheme to erase the host data from the portion of the memory, wherein during a first portion of the alternative erase scheme, a first voltage is applied to even word lines and a second voltage, that is different from the first voltage, is applied to odd word lines, and wherein during a second portion of the alternative erase scheme, a third voltage, which is different from the first voltage, is applied to the even word lines and a fourth voltage, which is different than the second voltage, is applied to the odd word lines.

16. The method of claim 15, wherein determining that the portion of the memory is associated with the reliability risk includes determining that the portion of the memory is associated with non-full block usage.

17. The method of claim 15, wherein the alternative erase scheme is associated with two erase pulses, wherein the first portion of the erase scheme occurs during a first erase pulse, of the two erase pulses, and wherein the second portion of the erase scheme occurs during a second erase pulse, of the two erase pulses.

18. The method of claim 15, wherein the memory is associated with a multi-deck memory, and wherein determining that the portion of the memory is associated with the reliability risk includes determining that the portion of the memory is associated with a lowermost deck, of the multi-deck memory.

19. The method of claim 15, wherein the alternative erase scheme is associated with an erase pulse, and wherein the first portion of the erase scheme and the second portion of the erase scheme occur during the erase pulse.

20. The method of claim 19, wherein the erase pulse is associated with a ramping-up portion of the erase pulse, a plateau portion of the erase pulse, and a ramping-down portion of the erase pulse, and wherein the first portion of the erase scheme and the second portion of the erase scheme occur during the plateau portion of the erase pulse.

* * * * *